(12) United States Patent
Huang et al.

(10) Patent No.: US 10,311,714 B2
(45) Date of Patent: Jun. 4, 2019

(54) USER INTERFACE FOR A REMOTE CONTROL APPLICATION

(75) Inventors: Steve LanPing Huang, Placentia, CA (US); Cheryl Scott, Newport Beach, CA (US); Wayne Scott, Newport Beach, CA (US)

(73) Assignee: UNIVERSAL ELECTRONICS INC., Santa Ana, CA (US)

( * ) Notice: Subject to any disclaimer, the term of this patent is extended or adjusted under 35 U.S.C. 154(b) by 1808 days.

(21) Appl. No.: 12/855,501

(22) Filed: Aug. 12, 2010

(65) Prior Publication Data
US 2010/0321201 A1 Dec. 23, 2010

Related U.S. Application Data

(60) Continuation of application No. 12/421,065, filed on Apr. 9, 2009, now Pat. No. 8,015,446, which is a
(Continued)

(51) Int. Cl.
*G08C 17/02* (2006.01)
*G06F 3/0481* (2013.01)
(Continued)

(52) U.S. Cl.
CPC ........... *G08C 17/02* (2013.01); *G06F 3/0481* (2013.01); *G06F 3/0484* (2013.01); *G06F 3/04817* (2013.01); *G06F 3/04842* (2013.01); *G06F 9/445* (2013.01); *G08C 17/00* (2013.01); *G08C 19/28* (2013.01); *G10L 17/22* (2013.01); *H03J 1/0025* (2013.01); *H04B 1/202* (2013.01); *H04L 12/2816* (2013.01); *H04L 41/509* (2013.01); *H04N 5/4403* (2013.01);
(Continued)

(58) Field of Classification Search
CPC ............................ G06F 3/0481; G06F 3/0484
USPC ................................................ 715/744, 747
See application file for complete search history.

(56) References Cited

U.S. PATENT DOCUMENTS

| 4,894,789 A | 1/1990 | Yee |
| 5,005,084 A | 4/1991 | Skinner |

(Continued)

FOREIGN PATENT DOCUMENTS

| EP | 0561435 A2 | 9/1993 |
| EP | 0801342 | 10/1997 |

(Continued)

OTHER PUBLICATIONS

USPTO, Notice of Allowance of U.S. Appl. No. 12/858,831, dated Jan. 22, 2013, 8 pages.
(Continued)

*Primary Examiner* — Ryan F Pitaro
(74) *Attorney, Agent, or Firm* — Greenberg Traurig, LLP

(57) ABSTRACT

A hand-held electronic device having a remote control application user interface that functions to displays operational mode information to a user. The graphical user interface may be used, for example, to setup the remote control application to control appliances for one or more users in one or more rooms, to perform activities, and to access favorites. The remote control application is also adapted to be upgradeable. Furthermore, the remote control application provides for the sharing of operational mode information.

18 Claims, 23 Drawing Sheets

Related U.S. Application Data division of application No. 11/340,442, filed on Jan. 26, 2006, now Pat. No. 7,895,532, which is a division of application No. 10/288,727, filed on Nov. 6, 2002, now Pat. No. 7,831,930.

(60) Provisional application No. 60/344,020, filed on Dec. 20, 2001, provisional application No. 60/334,774, filed on Nov. 20, 2001.

(51) Int. Cl.

| | | |
|---|---|---|
| G06F 9/445 | (2018.01) | |
| G08C 17/00 | (2006.01) | |
| G08C 19/28 | (2006.01) | |
| H03J 1/00 | (2006.01) | |
| H04B 1/20 | (2006.01) | |
| H04L 12/28 | (2006.01) | |
| H04N 5/44 | (2011.01) | |
| H04N 5/445 | (2011.01) | |
| H04N 5/50 | (2006.01) | |
| H04N 7/16 | (2011.01) | |
| H04N 7/173 | (2011.01) | |
| H04N 21/258 | (2011.01) | |
| H04N 21/41 | (2011.01) | |
| H04N 21/422 | (2011.01) | |
| H04N 21/436 | (2011.01) | |
| H04N 21/462 | (2011.01) | |
| H04N 21/485 | (2011.01) | |
| H04N 21/6547 | (2011.01) | |
| H04N 21/8543 | (2011.01) | |
| G06F 3/0484 | (2013.01) | |
| H04L 12/24 | (2006.01) | |
| G10L 17/22 | (2013.01) | |
| H04N 21/431 | (2011.01) | |
| H04N 21/47 | (2011.01) | |
| G06F 3/0482 | (2013.01) | |

(52) U.S. Cl.
CPC ..... *H04N 5/44543* (2013.01); *H04N 5/44582* (2013.01); *H04N 5/50* (2013.01); *H04N 7/16* (2013.01); *H04N 7/17318* (2013.01); *H04N 21/25891* (2013.01); *H04N 21/4126* (2013.01); *H04N 21/4131* (2013.01); *H04N 21/42204* (2013.01); *H04N 21/43615* (2013.01); *H04N 21/4622* (2013.01); *H04N 21/485* (2013.01); *H04N 21/6547* (2013.01); *H04N 21/8543* (2013.01); *G06F 3/0482* (2013.01); *G08C 2201/21* (2013.01); *G08C 2201/30* (2013.01); *G08C 2201/33* (2013.01); *G08C 2201/50* (2013.01); *G08C 2201/91* (2013.01); *G08C 2201/92* (2013.01); *H03J 2200/23* (2013.01); *H03J 2200/25* (2013.01); *H03J 2200/26* (2013.01); *H04B 1/20* (2013.01); *H04N 5/4401* (2013.01); *H04N 21/4316* (2013.01); *H04N 21/47* (2013.01); *H04N 2005/441* (2013.01); *H04N 2005/4425* (2013.01); *H04N 2005/4433* (2013.01)

(56) References Cited

U.S. PATENT DOCUMENTS

| | | | |
|---|---|---|---|
| 5,293,357 A | 3/1994 | Hallenbeck | |
| 5,307,055 A | 4/1994 | Baskin et al. | |
| 5,410,326 A | 4/1995 | Goldstein | |
| 5,450,079 A | 9/1995 | Dunaway | |
| 5,485,197 A | 1/1996 | Hoarty | |
| 5,552,806 A | 9/1996 | Lenchik | |
| 5,565,888 A | 10/1996 | Selker | |
| 5,574,964 A | 11/1996 | Hamlin | |
| 5,635,989 A | 6/1997 | Rothmuller | |
| 5,648,760 A | 7/1997 | Kumar | |
| 5,652,613 A | 7/1997 | Lazarus et al. | |
| 5,671,267 A | 9/1997 | August et al. | |
| 5,710,605 A | 1/1998 | Nelson | |
| 5,715,020 A * | 2/1998 | Kuroiwa et al. | 348/734 |
| 5,724,106 A | 3/1998 | Autry et al. | |
| 5,751,372 A | 5/1998 | Forson | |
| 5,761,606 A | 6/1998 | Wolzien | |
| 5,793,438 A | 8/1998 | Bedard | |
| 5,801,787 A | 9/1998 | Schein et al. | |
| 5,828,419 A | 10/1998 | Bruette et al. | |
| 5,835,864 A | 11/1998 | Diehl et al. | |
| 5,838,775 A | 11/1998 | Montalbano | |
| 5,855,006 A | 12/1998 | Huemoeller et al. | |
| 5,900,875 A | 5/1999 | Haitani et al. | |
| 5,901,366 A | 5/1999 | Nakano et al. | |
| 5,915,026 A | 6/1999 | Mankovitz | |
| 5,936,611 A | 8/1999 | Yoshida | |
| 5,945,988 A | 8/1999 | Williams et al. | |
| 5,956,025 A | 9/1999 | Goulden et al. | |
| 5,970,206 A | 10/1999 | Yuen et al. | |
| 5,974,222 A | 10/1999 | Yuen et al. | |
| 6,002,394 A | 12/1999 | Schein et al. | |
| 6,002,450 A | 12/1999 | Darbee et al. | |
| 6,012,071 A | 1/2000 | Krishna et al. | |
| 6,018,372 A | 1/2000 | Etheredge | |
| 6,020,881 A | 2/2000 | Naughton et al. | |
| 6,028,599 A | 2/2000 | Yuen et al. | |
| 6,028,600 A | 2/2000 | Rosin et al. | |
| 6,040,829 A | 3/2000 | Croy et al. | |
| 6,067,552 A | 5/2000 | Yu | |
| 6,097,441 A | 8/2000 | Allport | |
| 6,104,334 A | 8/2000 | Allport | |
| 6,127,941 A | 10/2000 | Van Ryzin | |
| 6,130,726 A | 10/2000 | Darbee et al. | |
| 6,133,909 A | 10/2000 | Schein et al. | |
| 6,137,549 A | 10/2000 | Rasson et al. | |
| 6,151,059 A | 11/2000 | Schein et al. | |
| 6,172,674 B1 | 1/2001 | Etheredge | |
| 6,177,931 B1 | 1/2001 | Alexander et al. | |
| 6,195,589 B1 | 2/2001 | Ketcham | |
| 6,198,481 B1 | 3/2001 | Urano et al. | |
| 6,211,856 B1 | 4/2001 | Choi et al. | |
| 6,211,870 B1 | 4/2001 | Foster | |
| 6,211,921 B1 | 4/2001 | Cherian et al. | |
| 6,219,694 B1 | 4/2001 | Lazaridis et al. | |
| 6,256,019 B1 | 7/2001 | Allport | |
| 6,266,098 B1 | 7/2001 | Cove et al. | |
| 6,278,499 B1 | 8/2001 | Darbee et al. | |
| 6,285,357 B1 * | 9/2001 | Kushiro et al. | 345/169 |
| 6,311,329 B1 | 10/2001 | Tarakado et al. | |
| 6,341,374 B2 | 1/2002 | Schein et al. | |
| 6,369,840 B1 | 4/2002 | Barnett et al. | |
| 6,408,435 B1 | 6/2002 | Sato | |
| 6,437,836 B1 | 8/2002 | Huang et al. | |
| 6,463,463 B1 | 10/2002 | Godfrey et al. | |
| 6,532,589 B1 | 3/2003 | Proehl et al. | |
| 6,538,635 B1 | 3/2003 | Ringot | |
| 6,563,430 B1 | 5/2003 | Kemink et al. | |
| 6,577,350 B1 | 6/2003 | Proehl et al. | |
| 6,597,374 B1 | 7/2003 | Baker et al. | |
| 6,650,894 B1 | 11/2003 | Berstis et al. | |
| 6,670,971 B1 | 12/2003 | Oral | |
| 6,690,392 B1 | 2/2004 | Wugoski | |
| 6,710,771 B1 | 3/2004 | Yamaguchi et al. | |
| 6,721,288 B1 | 4/2004 | King et al. | |
| 6,822,661 B2 | 11/2004 | Sai et al. | |
| 6,848,104 B1 | 1/2005 | Van Ee et al. | |
| 6,909,378 B1 * | 6/2005 | Lambrechts et al. | 340/4.32 |
| 6,938,101 B2 | 8/2005 | Hayes et al. | |
| 6,996,779 B2 | 2/2006 | Meandzija et al. | |
| 7,111,320 B1 * | 9/2006 | Novak | 725/139 |
| 7,746,244 B2 | 6/2010 | Wouters | |
| 2001/0053274 A1 | 12/2001 | Roelofs et al. | |
| 2002/0070920 A1 * | 6/2002 | Challener et al. | 345/168 |
| 2002/0093490 A1 | 7/2002 | Lee | |

(56) References Cited

U.S. PATENT DOCUMENTS

| | | |
|---|---|---|
| 2002/0178238 A1 | 11/2002 | Fletcher et al. |
| 2003/0058269 A1 | 3/2003 | Dunstan |
| 2003/0095156 A1 | 5/2003 | Klein et al. |
| 2004/0031045 A1 | 2/2004 | Ivanyl |
| 2004/0073707 A1 | 4/2004 | Dillon |
| 2005/0024226 A1* | 2/2005 | Hayes et al. ............. 340/825.22 |
| 2005/0028208 A1 | 2/2005 | Ellis et al. |
| 2007/0229465 A1 | 10/2007 | Sakai et al. |
| 2009/0138903 A1 | 5/2009 | Blanchard et al. |
| 2013/0070093 A1 | 3/2013 | Rivera et al. |

FOREIGN PATENT DOCUMENTS

| | | |
|---|---|---|
| EP | 0967797 A2 | 12/1999 |
| EP | 0987888 | 3/2000 |
| EP | 1061490 | 12/2000 |
| EP | 1204275 A2 | 5/2002 |
| GB | 2343073 | 4/2000 |
| WO | 98/16062 | 4/1998 |
| WO | 9817063 A1 | 4/1998 |
| WO | 00/17737 | 3/2000 |
| WO | 00/27030 | 5/2000 |
| WO | 00/40016 | 7/2000 |
| WO | 00/58935 | 10/2000 |
| WO | 0078050 A | 12/2000 |
| WO | 01/20572 A1 | 3/2001 |
| WO | 0124473 A1 | 4/2001 |
| WO | 0148661 A2 | 7/2001 |
| WO | 01/74051 | 10/2001 |

OTHER PUBLICATIONS

Sony Corporation, Integrated Remote Commander, 2000, pp. 1-76.
U.S. Patent Office, Non-Final Office Action issued on U.S. Appl. No. 13/801,157, dated Sep. 21, 2017, 19 pgs.
U.S. Patent Office, Non-Final Office Action issued on U.S. Appl. No. 14/047,072, dated Dec. 21, 2017, 28 pgs.
U.S. Patent Office, Non-Final Office Action issued on U.S. Appl. No. 15/284,616, dated Nov. 27, 2018, 13 pgs.

* cited by examiner

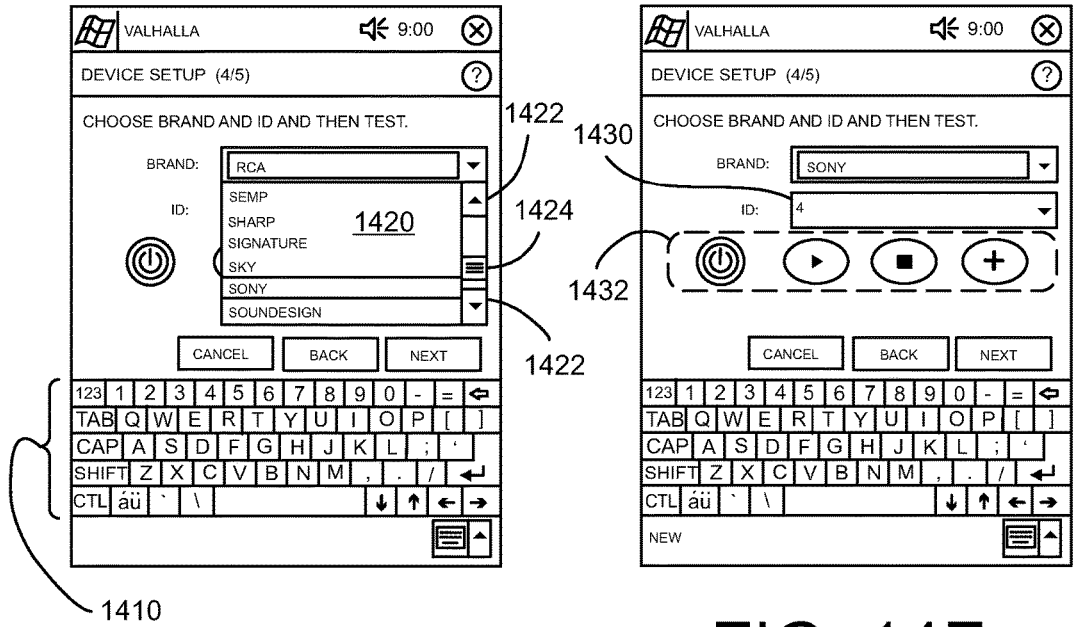
FIG. 14E    FIG. 14F
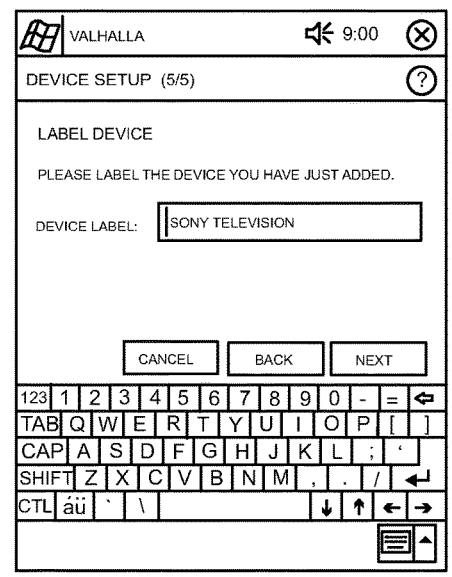 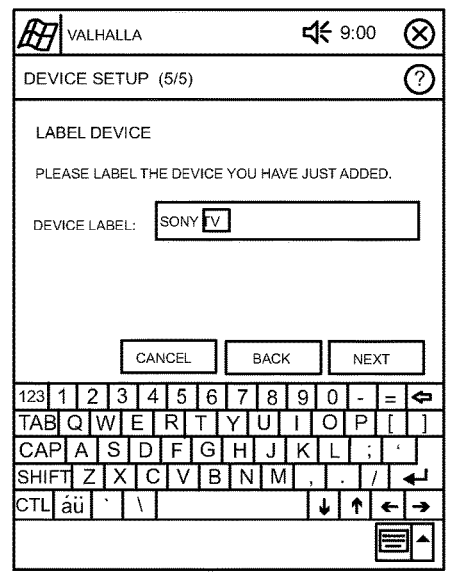
FIG. 14G    FIG. 14H

USER INTERFACE FOR A REMOTE CONTROL APPLICATION

RELATED APPLICATION INFORMATION

This application is a continuation of U.S. application Ser. No. 12/421,065, filed on Apr. 9, 2009, which application was filed as a divisional of U.S. application Ser. No. 11/340,442, filed Jan. 26, 2006, which application was filed as a divisional of U.S. Application No. 10/288,727, filed Nov. 6, 2003, which, in turn, claims the benefit of U.S. Provisional Patent Application Nos. 60/344,020 filed on Dec. 20, 2001 and 60/334,774 filed on Nov. 20, 2001.

These applications, from which priority is claimed, are hereby incorporated by reference in their entirety.

BACKGROUND OF THE INVENTION

This invention relates generally to hand-held electronic devices and, more particularly, relates to a user interface for an universal remote control application resident on the hand-held electronic device.

Universal remote controls for controlling the operation of multiple, diverse home appliances are well known. In this regard, universal remote controls perform a valuable function by consolidating three, four, five, and more remote controls into one device. However, as more remotely controllable appliances enter the homes of consumers and the number of remotely controllable operations increase, the user interface of the universal remote control becomes increasingly more complex. This complexity arises from the need to provide more and more keys which are used to initiate the transmission of the control codes that control the increasing number of operations of the increasing number of home appliances. Disadvantageously, as the user interface of the universal remote control becomes more cluttered, the usability of the universal remote control diminishes. Accordingly, a need exists for a universal remote control having an improved user interface that simplifies the operation of the universal remote control and, as such, the remote operation of consumer appliances.

SUMMARY OF THE INVENTION

In accordance with these needs, the subject invention is directed to a hand-held electronic device having a remote control application user interface that functions to display operational mode information to a user. Representative platforms for the hand-held electronic device include, but are not limited to, devices such as personal digital assistants, Web tablets, lap-top computers, extended-functionality mobile phones, remote control devices, etc. which are collectively referred to hereinafter as "PDAs." An understanding of the objects, advantages, features, properties and relationships of the remote control application user interface will be obtained from the following detailed description and accompanying drawings which set forth illustrative embodiments which are indicative of the various ways in which the principles of the remote control application user interface may be employed.

BRIEF DESCRIPTION OF THE DRAWINGS

For a better understanding of the remote control application user interface, reference may be had to various preferred embodiments shown in the following drawings in which.

DETAILED DESCRIPTION

Exemplary embodiments of a user interface for an universal remote control application resident on the hand-held electronic device are illustrated and described which provide a next generation of home automation and consumer electronic controls. Representative platforms for the hand-held electronic device include devices supporting the Windows CE brand operating system or PocketPC type devices that include built-in support for transmitting consumer equipment IR remote control codes. Exemplary devices include, but are not limited to, devices such as the Compaq (now HP) iPAQ brand model 3950 or 3970 that include a hardware module to house the IR transmitter and an IR database of consumer electronics command codes, along with a remote control application that is used to control the operations of various consumer appliances. Other platform implementations using either built-in or add-on hardware to implement the IR transmit functionality are also possible, using other Windows CE brand class devices or other software systems such as, for example, the Palm brand operating system. While the descriptions that follow are particularly illustrated using an iPAQ PocketPC brand platform, it will be appreciated by those of ordinary skill in the art that these teachings can be easily adapted to other platforms and software systems, for example, by making simple adjustments to display graphic sizes and layouts, file formats, etc., where needed to adapt to the different operating environment.

Figure 1:
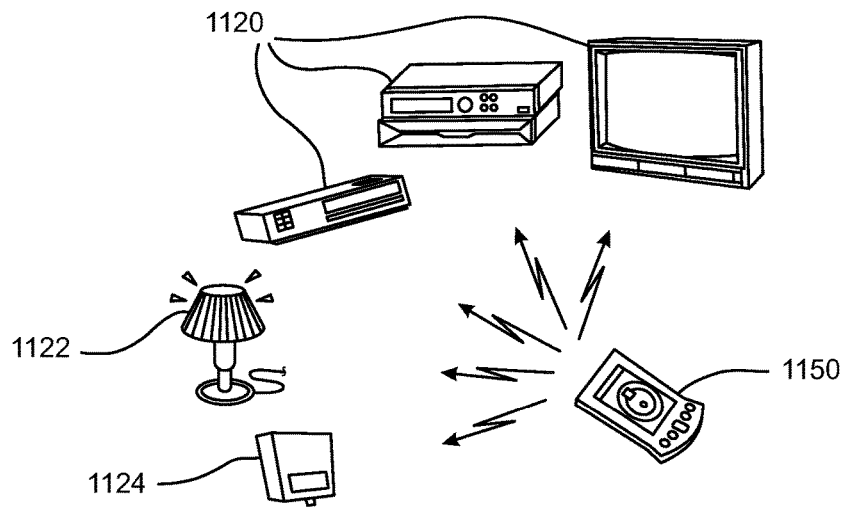
FIG. 1 illustrates an exemplary system in which a PDA is adapted to control consumer appliances.
Figure 2:
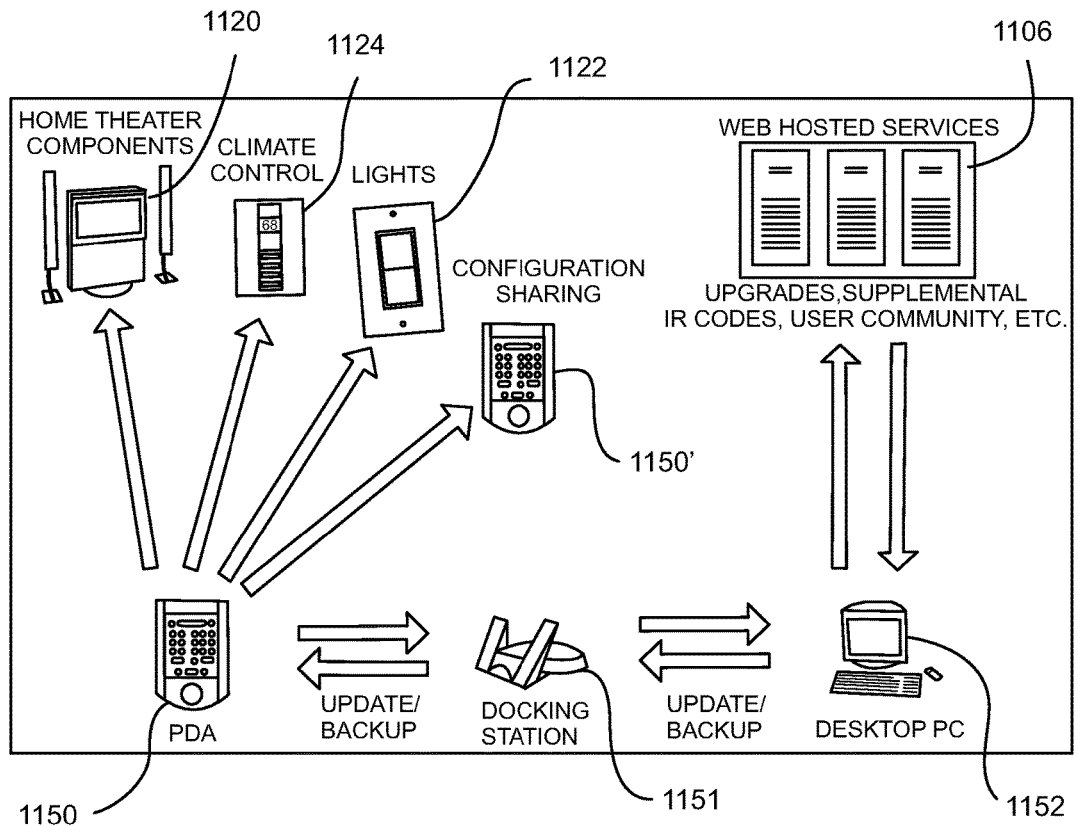
FIG. 2 illustrates an exemplary system in which a PDA receives updates and supplemental IR codes from a Web site.
Figure 3:
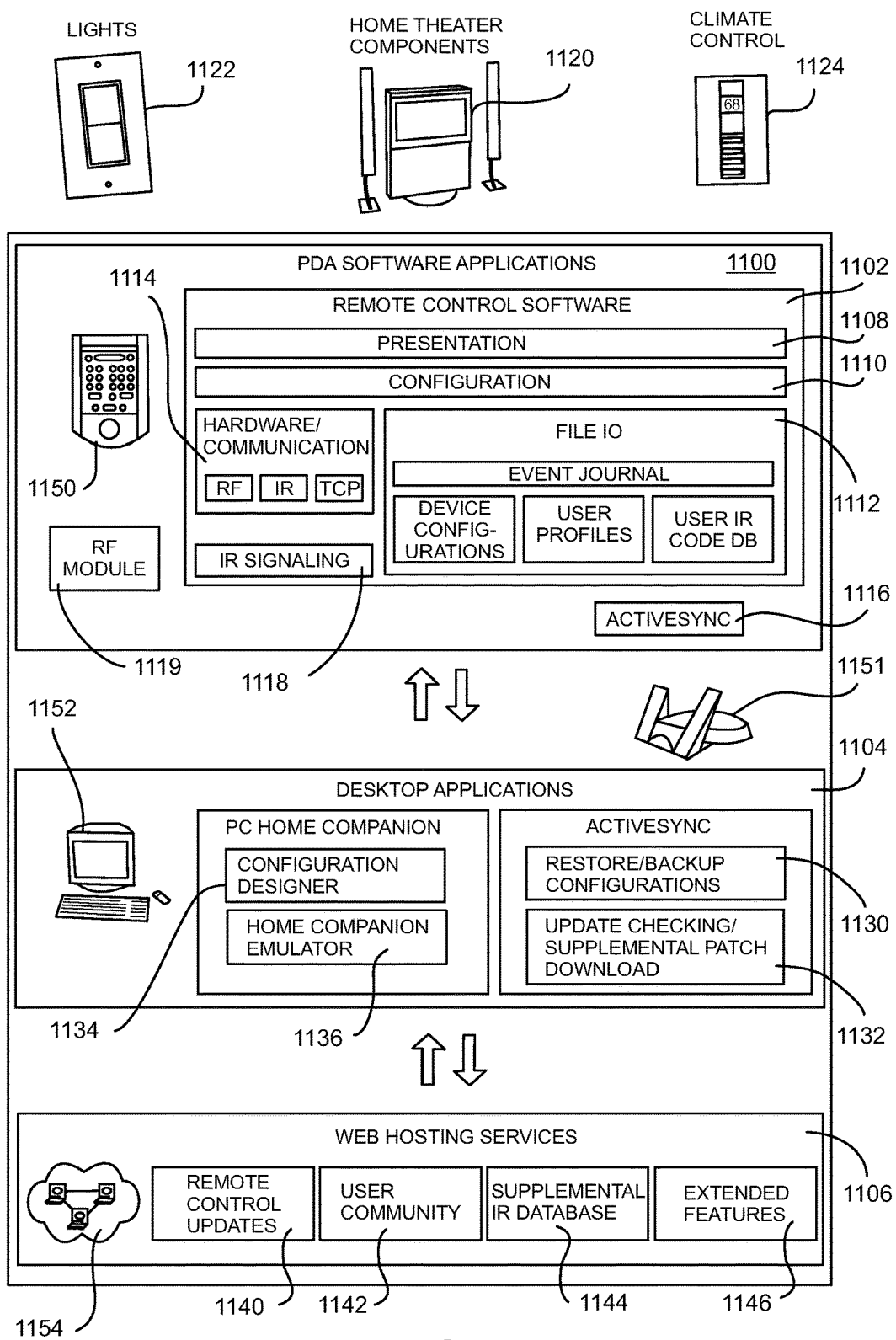
FIG. 3 illustrates the internal topology of an exemplary system in which a PDA is adapted to control consumer appliances.

Turning to FIGS. 1 and 2 there is illustrated a system in which a PDA device 1150 is adapted to provide wireless control of consumer appliances such as home entertainment equipment 1120, lighting 1122, and temperature control 1124. Control signals are provided, for example, by causing the PDA 1150 to emulate the wireless signals (IR, RF, etc.) used by the standard remote controls originally supplied with the respective appliances. The PDA 1150 is also preferably adapted to interact with Web-hosted services 1106, such as IR code updates, graphics, software enhancements, electronic program guides (EPGs), etc., via a host desktop computer 1152 and docking station 1151 as particularly illustrated in FIG. 2. It will be appreciated by those skilled in the art that the Web-hosted services may also be accessed directly, sans an intervening host desktop computer, in cases where the PDA 1150 is adapted to communicate directly to the Internet. Still further, the PDA 1150 may be adapted to share all or part of a user's programmed configuration settings with other compatible PDAs 1150'. An exemplary graphical representation of the topology of such an exemplary system is illustrated in FIG. 3 which depicts the major components of the remote control application and the environment in which it operates. Represented in FIG. 3 are the PDA 1150, the host desktop PC 1152, and Web Server(s) accessible through the Internet 1154.

The PDA Software Application 1100 described hereinafter and shown graphically in FIG. 3 generally comprises four program segments that would typically be installed on the PDA 1150 in order to control, for example, home entertainment components 1120 and home automation components such as lights 1122 and climate control 1124. By way of illustrative example, the four program segments comprise:

Remote Control Software 1102: This application allows the user to control their consumer electronic devices. The application provides users with an easy and intuitive way to manage their home entertainment equipment as well as home automation devices (such as X10 type devices) within the home. The remote control application itself may comprise four major architectural subcomponents, although only the top level (referred to as the "presentation engine") is exposed to the end user. These four components, the presentation engine 1108, the configuration engine 1110, the hardware communication manager 1114, and the file I/O manager 1112 will be described in more detail hereinafter.

ActiveSync Software 1116: This application is used as a communications conduit to and from a remote control companion application that is installed on the host desktop PC 1152.

IR Signaling Software 1118: This application performs the IR signal generating functions to universally control appliances; supporting a database of IR codes and transmission protocols for use in conjunction with the IR hardware components described later with reference to FIG. 4.

RF Module Software/Hardware 1119: A Bluetooth or 802.11 RF module may optionally perform the RF signal generation to control RF devices and/or communicate wirelessly with a server or other applications resident on the host desktop PC 1152. It will be appreciated that such an RF Module may be used either together with or in place of the above mentioned IR Signaling to effect control of home appliances.

As noted, the ActiveSync software 1116 cooperates with a remote control companion application 1104 installed on the host desktop PC 1152. This combination of applications generally implements a standard Microsoft-based ActiveSync brand utility that functions as a communications conduit to/from the remote control application. Software supplemental to the ActiveSync brand applications may be required to ensure that data required for the remote control application is passed along the conduit in an appropriate fashion. Such supplemental software would be used to restore/backup configurations 1130 (e.g., which allows configuration files and event journals to be backed-up and restored) and to check updates/download supplemental patches 1132 (e.g., which reviews current version numbers of software, IR code databases, etc. and ensures that the latest versions are the ones available for download). It will be appreciated by those skilled in the art that these functions may be performed by software stored locally (e.g., on the PDA 1150 and/or host computer 1152) or via the Web using, for example, Java applications. Optional desktop applications may also be used to edit 1134 and/or emulate 1136 the configuration and appearance of the PDA based remote control application on the desktop system 1152.

Services and data that are located on a hosted site 1106 are represented by the remote control software services. The remote control software services may include remote control application software updates 1140, supplemental IR database updates 1144 (including additional devices and/or key functions for download), and/or a remote control user community 1142 which, for example, might allow users to download additional graphics for interface customization, upload their configuration files to share with other users, etc. This user community 1142 is also where third party developed software extensions may be placed for download if desired. The hosted site 1106 may also be the source of data that is used in conjunction with extended features 1146 of the remote control application 1146, for example downloadable electronic program guide ("EPG") information, cable channel lineups, movie schedules and the like.

The remote control application software 1102 may also include the following high level functions: setup wizards; consumer appliance control through IR and/or RF signal transmissions; customization features including the ability to learn IR codes, assign and playback macros, reassign keys, program favorites including rapid assignment of channel numbers to network logos, configure multiple user profiles, set restore points, configure a guest mode, customize the remote control application from the host or remote computer including the downloading of new IR codes and key functions, skins, additional network logos, software extensions; copying of configuration data from one PDA to another; journaling activity; and an API for third party developers to build extensions. These functions will be described in more detail in the following paragraphs.

Setup Wizards

The intent of a setup wizard is to get the PDA 1150 configured for use as quickly as possible. A setup wizard is normally a specialized part of an application program that functions to guide a user through a step-by-step setup or configuration process. Information utilized in connection with a setup wizard may be pre-populated so that there is an increased likelihood of a user successfully getting the desired results.

By way of example, a user setup wizard serves to setup the remote control application 1150 to identify one or more users and their preferences. For initial user setup, the user setup wizard may read data directly from the owner registration information file(s); no additional information would be required to use the remote control application. Alternatively, for initial user setup, the user setup wizard need not be invoked with the owner registration information file(s) being read and utilized by default.

By way of further example, a device setup wizard would be used to establish the list of devices that the remote control application is configured to control as well as how the devices should be controlled. To this end, the graphical user interface of the remote control application may start by displaying a small number of device buttons (e.g., buttons that would be activated to place the remote control application into a mode to control a device) that would initially be un-setup. Selection of an un-setup device button can be used to automatically invoke the device setup wizard. It is to be appreciated that the device setup wizard will be invoked each time the remote control application is setup to control a new device or when it is desired to add or change settings for an already setup device. Like the device setup wizard, the user setup wizard can be invoked multiple times to add more users. When invoking a setup wizard, the remote control application may be able to detect if a setup process has already been executed and may display the current settings to the user for confirmation or changing.

As will be described hereinafter, setup may prompt the user for the type of install to perform (typical or custom). For custom setup, the user may specify what level of device support is desired (standard, power, expanded). The setup wizard may chain together the functionality from different customization screens. Two major areas of customization are user setup and device setup. The user may be required to run the setup wizards sequentially from the beginning or may select a specific setup wizard or portion of a setup wizard to run after initial configuration of the remote control application. The remote control application may store user preferences in a configuration file and may recall configuration file preferences for inclusion in the setup wizard screens upon subsequent execution of those set wizards (e.g., in the performance of an edit of a setup).

Consumer Appliance Control

Once the PDA 1150 has been setup, via the remote control application, to control a device, the remote control application may be invoked to allow the PDA 1150 to be used as the primary Infrared (IR) remote control for the setup devices. In this regard, devices include conventional consumer appliances, such as televisions, VCRs, DVD players, PVRs, etc. Devices may also include home automation devices. While home automation devices may appear to be different from what might be viewed as convention consumer appliances (e.g., home theater equipment), from the standpoint of the remote control application, they are quite similar. As long as the home automation device can be controlled (e.g., via IR, RF, signals), the remote control application can cause the transmission of signals to the home automation device. Thus, the graphical user interface of the remote control application may support controls buttons, sliders, etc., e.g., via the use of bitmap images, to support operations unique to home automation devices (e.g., lights dim/brighter, curtains open/close, fan rotation speed, etc.).

Remote Control Application Customization

Remote control application customization allows a user to modify the graphical user interface, device and/or function control capabilities, etc, or the remote control application and/or PDA platform. Generally, any remote control application customization would be assisted by a setup wizard. Modifications achievable via customization include, by way of example, learning IR codes, assigning and playing back macros, specifying favorites (assigning channel numbers and/or the IR sequences necessary to cause entertainment appliances to switch channels to network logos), setting user security levels, etc. Before modifications are made, an automatic backup of the settings of one or more component parts of the remote control software application may be made so that the user can undo changes if they did not achieve the desired results.

Remote Control Application Customization From PC/External Updates

Settings usable in connection with the remote control application (e.g., skins, macros, etc.), remote control application updates, IR code updates, etc. may also be added, deleted, and/or modified based on information stored in external systems. The information may have originated on a Website, the host computer 1152, etc.

Journal Activity

The system may be configured to journal (i.e., log) some or all of the activities of the user(s) and/or the system into a file that may be stored on the PDA 1150. By way of example, some of the journal data may be accessed to determine the most recently viewed channels, may be used to generate and/or update favorites with an adaptive learning feature, etc. The journal data may also be made available for debugging purposes, for example by being synchronized with Web servers 1154 to accelerate the speed with which a support team can debug issues.

Extensible Through API for Third Party Developers

The system design may include an API that third party software developers can use to add functionality to the remote control application, communicate with remote control application, etc.

Electronic Program Guide ("EPG")

With an EPG application on the PDA 1150 the user can view upcoming shows and choose which shows to watch without distracting anyone else watching the TV. In addition, the remote control application may work in conjunction with the EPG application to prompt a user to watch a program, allow them to command tuning to a program, record a program, etc.

Operating Environment

It is anticipated that the major operating environment for the PDA 1150 would be the living room/home theater room in the home. However, the remote control application may be shipped with pre-configured lists of devices and device types associated with multiple rooms, including the office. The lists may be modified. Furthermore, a setup wizard can be used to configure the remote control application for one or more distinct rooms.

Hardware Components

Figure 4:
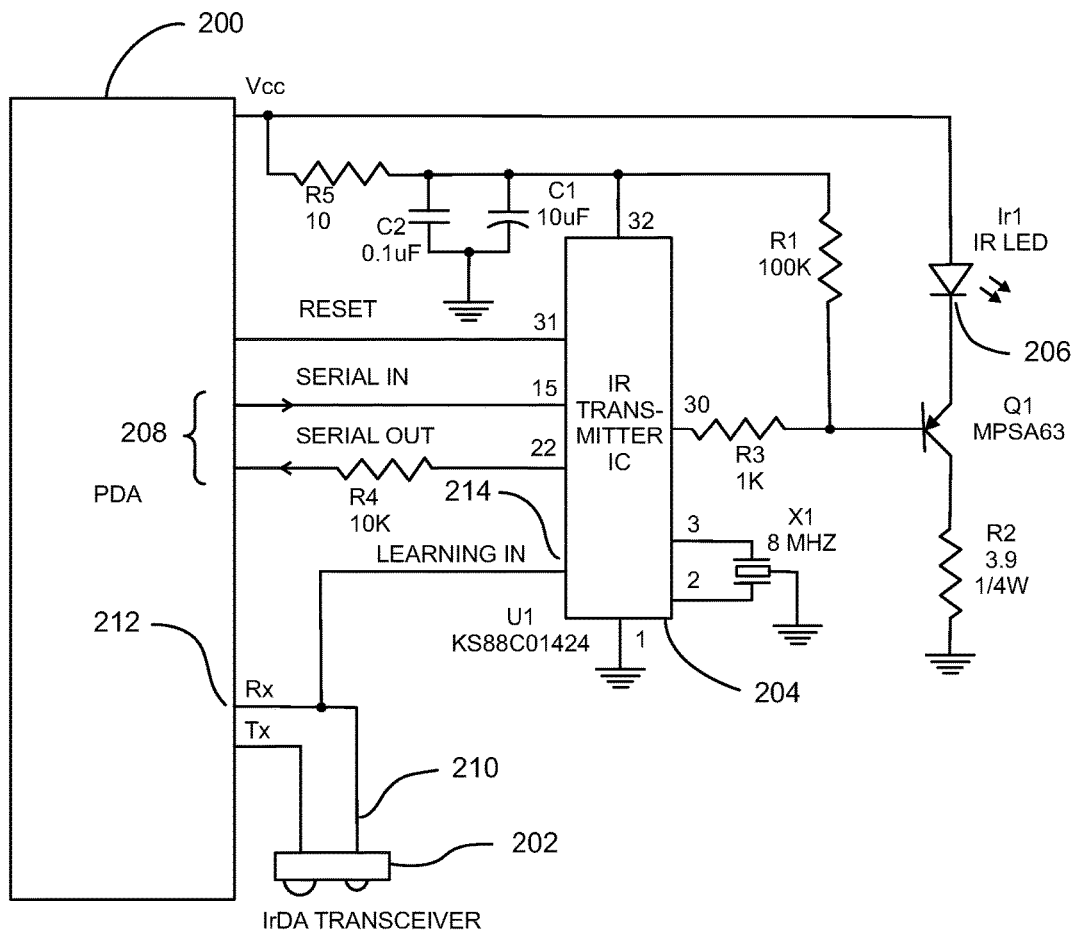
FIG. 4 illustrates an exemplary hardware circuit for enabling a PDA to transmit consumer appliance IR codes.

The basic hardware components and architecture of a PDA that serves as a platform for the remote control application are well known in the art. Accordingly, for the sake of simplicity, only exemplary, select hardware features unique to the remote control functionality will be discussed in detail. Referring to FIG. 4, a standard PDA 200 has an IrDA transceiver 202 used for short range communication with other PDAs and peripheral devices. In addition, since the controllable devices generally uses an IR wavelength different than that used by IrDA, the exemplary platform is also equipped with an IR transmitter IC 204 and separate LED 206 suitable for use with device IR control. In one embodiment, an IR signaling module 1118 communicates with the IR transmitter IC 204 through a serial connection 208 (for example COM1/COM4). Methods and command protocols for communicating with such an IR transmitter IC 204 over a serial interface are well known and, therefore, need not be described further herein (for example, see co-pending application Ser. No. 09/905,432). It will also be appreciated by those skilled in the art that, while in the illustrated example the transmitter pulse timing is controlled by the specialized chip shown, in other embodiments it may be possible to implement these timing functions via software running in the main CPU itself which would serve as a substitute for the IR transmitter IC 204. In addition, when adapted for use in connection with the remote control application, the IrDA receiver may also be used for learning IR codes from other devices such as originally supplied remote controls. The learning function would be made possible by paralleling the IrDA receiver output signal 210 to both the normal PDA connection 212 and the learning input 214 of the IR transmitter IC as shown.

The remote control application may also take advantage of any hard keys that are provided on the PDA 1150. For example, the illustrated iPAQ brand PocketPC shown in FIG. 10 includes a navigation pad 104 and four additional keys 102 ("hotkeys") at the bottom of the unit which are normally used to facilitate rapid access to frequently used applications such as a calendar application, address book application, etc. In one exemplary embodiment, the remote control application may place appropriate calls to the underlying operating system API to override the default hotkey functions and replace them with commonly-used remote control functions (e.g., volume or channel adjust, etc.). Furthermore, key override may be configured to occur only when the remote control application is the active or in-focus application. In this manner, if the user changes to another application, e.g., the Excel brand spreadsheet application, while the remote control application is still running, the hardware hotkeys revert back to their previous setting until the remote control application is made active again. Additionally, the assignment of functionality to the hardware keys may be user configurable and/or automatically determined by the current mode of operation of the remote control application as described in more detail hereinafter.

The remote control application may also provide for the overriding of any default shut-off timing. In this manner, the shut-off timing of the display can be configured to be more appropriate for use in connection with a user's need to operate devices when the remote control application is the program with "focus." For example, by replacing the normal shut-off timeout with a two-stage process such as: after 15 seconds with no activity, switch to a splash screen then, after 5 additional seconds, power down. Alternatively, these timeout values may be made user-adjustable.

Software Components

Figure 5:
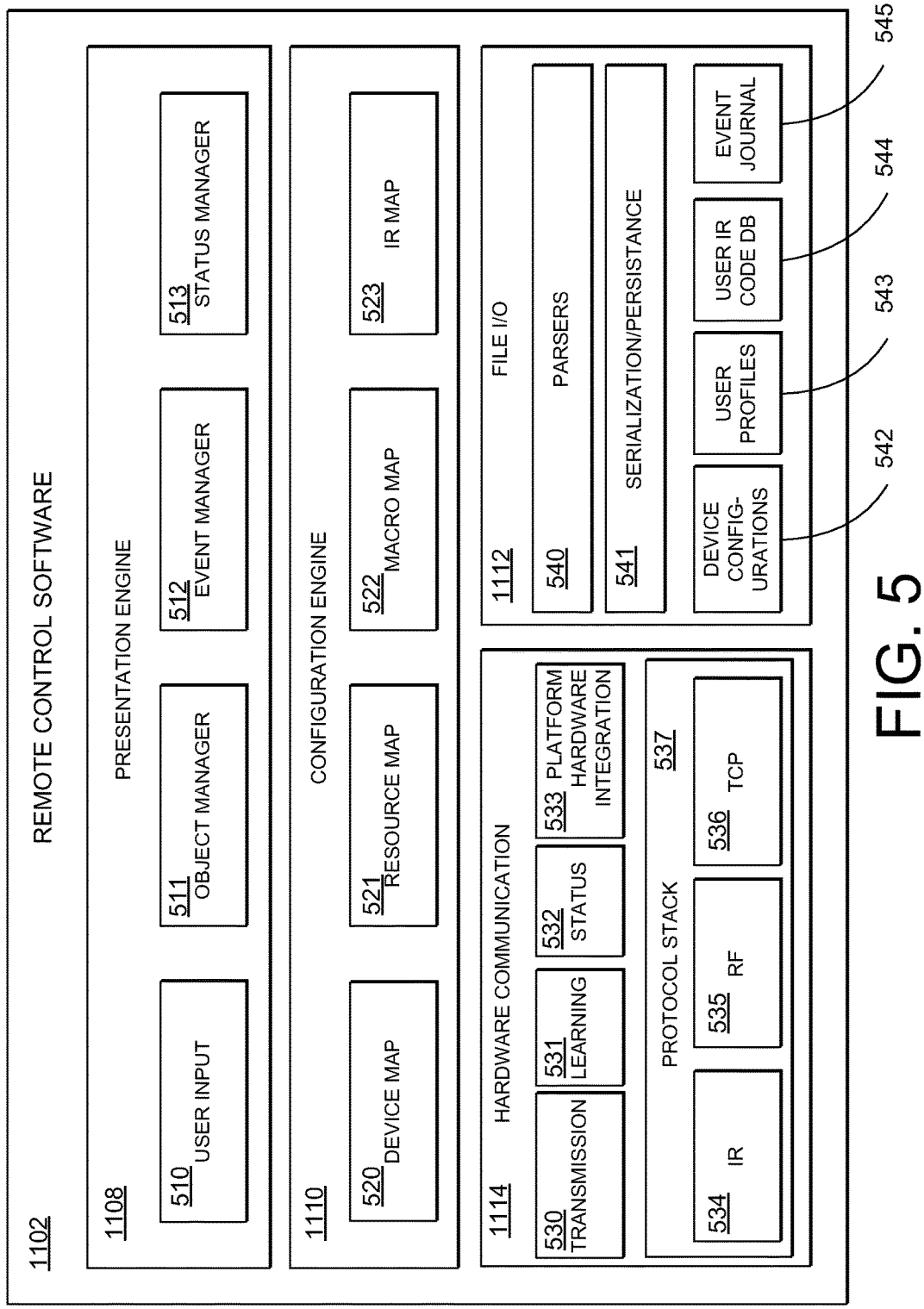
FIG. 5 illustrates an exemplary remote control application software architecture for a PDA.

Exemplary components of the remote control application 1102 are depicted in FIG. 5. The illustrated components comprise a presentation engine 1108, a configuration engine 1110, a hardware communications manager 1114 and a file I/O manager 1112. Each of these will be discussed in more detail in the following sections.

Presentation Engine

The presentation engine 1108 manages the user interface that users interact with to command the operation of the remote control application, for example, to cause the transmission of commands to devices. The presentation engine 1108 manages the mapping of the user configuration into the current hardware form factor—the iPAQ brand PDA in the exemplary embodiment, but in other embodiments this may be a WebPad or Tablet PC, a remote control software emulator, a remote control itself, etc.

User Input

The user input module 510 handles all input events generated by the user. This may include input from both the touch screen and hard keys. It may also handle input from a speech recognition software engine, for example the IBM ViaVoice brand software installed by default on the iPAQ 3950 brand PDA, or such other speech recognition applications as may be available. An action map 514 (see FIG. 18) controls all of the actions the user can perform for each device type. Thus, user input events would be processed in terms of the action map 514.

Object Manager

The object manager module 511 manages resources used to create display screens. The object manager may also manage intrinsic controls as well as controls developed by third parties.

Event Manager

The event manager module 512 may interface with an operating system calendaring function when events can be scheduled in the system.

Status Manager

The status manager module 513 may create a listening thread to capture any status broadcasts from devices. It may also track the current status of the remote control interface application, e.g., to determine if it is currently on a control page, a favorites page, running a setup Wizard, etc.

Configuration Engine

The configuration engine module 1110 manages the configuration resources and creates display screens using the presentation engine module. Resources for the configuration engine 1110 are generally stored in a configuration file.

Resource Map

The resource map 521 may contain any bitmaps, string literals, page layouts, and other resources utilized in the remote control application.

IR Map

The IR map 523 contains any user-defined IR codes to be used by the system. These codes may have been learned or downloaded. The IR map may also contain links to an IR database associated with the IR transmitter IC and/or the main or supplementary memory system of the PDA 1150. IR map links may be created at runtime to account for a possible change in mapping between IR database revisions.

Macro Map

The macro map 522 contains a list of the macros available within the system. Each control that executes a macro may refer to the macro map.

Device Map

Figure 18:
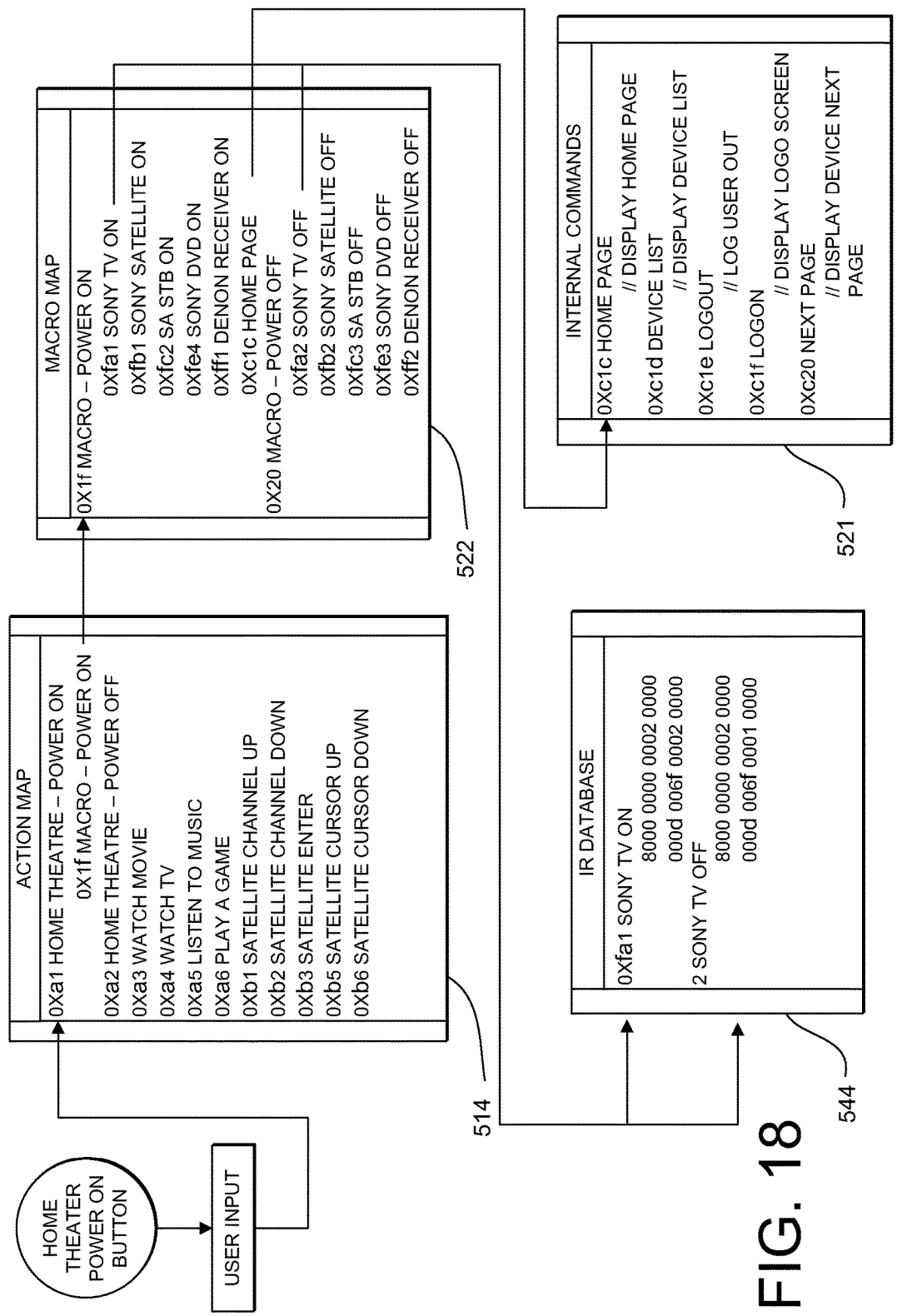
FIG. 18 illustrates an exemplary set of data relationships for execution of a remote control application macro function.

The device map 520 manages the links between the different types of information (resource map, IR map, and the macro map) for each appliance the remote control application has been configured to interact with. FIG. 18 is an example of how the various maps relate to each other as a user performs an action, in this case a macro (turning the power on for the home theater) as will be described in more detail hereinafter.

Hardware Communication Manager

Figure 6:
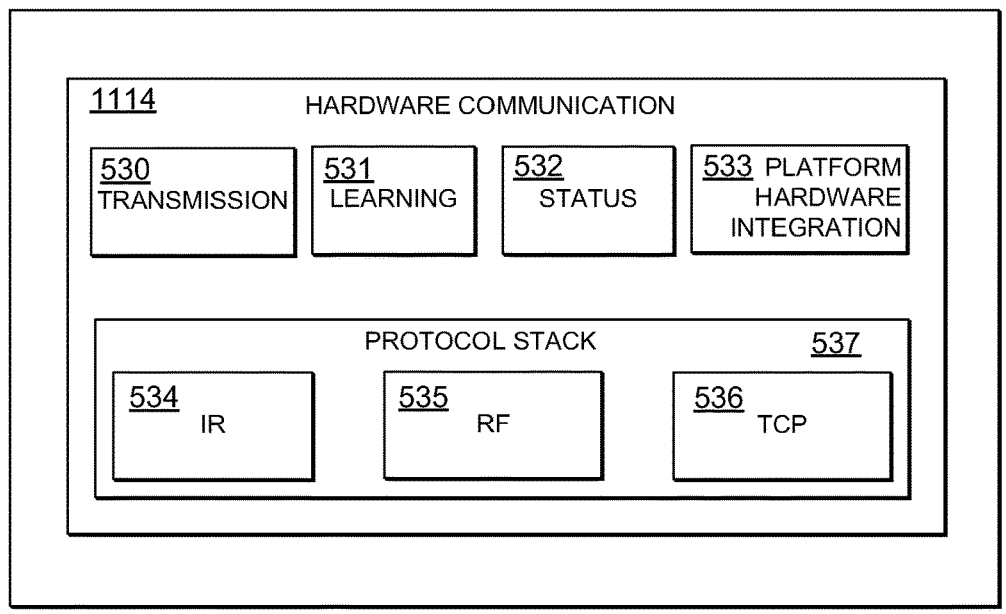
FIG. 6 illustrates an exemplary hardware communication manager software architecture for a PDA.

The hardware communication manager module 1114 communicates with devices external to the system utilizing the IR, Bluetooth, and 80211.b RF hardware, and possibly others. As new hardware is developed, access to such hardware may be through a specified interface within the hardware communication manager. FIG. 6 depicts exemplary hardware communications interfaces. Each of the interface objects is discussed briefly below.

Transmission

The transmission object 530 is utilized to control the output of a byte sequence via the required protocol stack (e.g., IR, RF or TCP).

Learning

The learning object 531 is utilized to control the learning of a byte sequence via the required protocol stack, for example data acquired via the shared IR/IrDA input 214 to the IR transmitter IC 204.

Status

The status object 532 is utilized to listen for broadcast messages on a particular protocol stack. This may be used for a two-way conversation between the PDA 1150 and other device hardware, e.g., hardware within home theatre and home automation systems.

Platform Hardware Integration

The platform hardware integration object 533 allows the remote control application to utilize the particular hardware capabilities of the PDA 1150 on which the remote control application is currently installed.

Protocol Stack

The protocol stack 537 is an abstraction layer between the different protocols used by the system to communicate with hardware within the home. A basic version of the remote control application may only use the IR protocol stack 534, while more advanced (in capability) versions of the remote control application may use one or more additional protocol stacks (535, 536) either in conjunction with or instead of the IR protocol stack.

IR

IR protocol 534 is used to communicate with any device using IR. The IR object may interface with an IR transmitter IC 204 for transmission and learning.

RF

RF protocol 535 is used to communicate with any devices using radio frequencies. The RF component may be used to abstract the communication between the remote control application and proprietary protocols, for example, Bluetooth, Zigbee, 802.11, or other RF signals.

TCP

TCP 536 may be used more and more as the home becomes wired and devices become connected via standard networking protocols such those used in conjunction with, for example, the IEEE 801.11b standard. The TCP stack may allow the remote control application to work with any wired device within the home, regardless of location. The TCP stack may also allow the user to communicate with the home from a remote location via the Internet or other conduit.

The File I/O Manager

Figure 7:
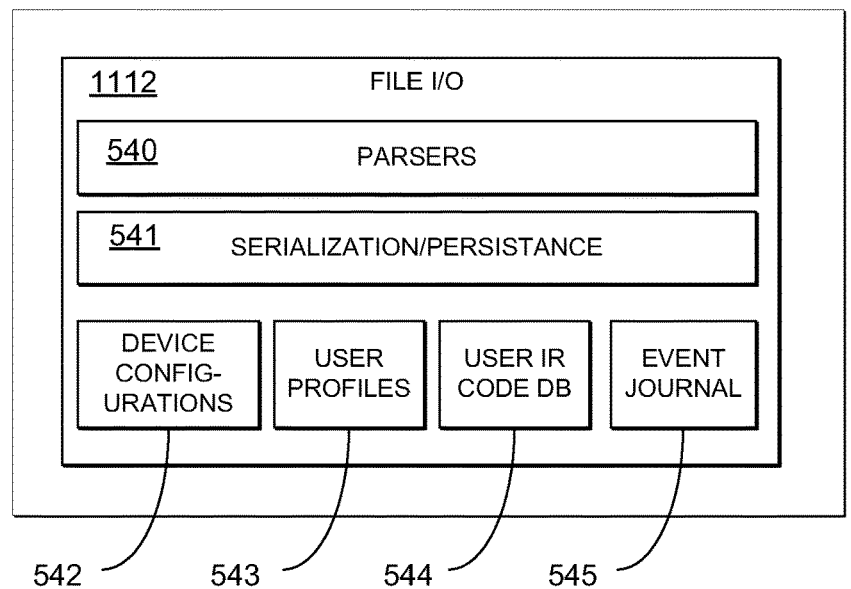
FIG. 7 illustrates an exemplary file I/O manager software architecture for a PDA.

The file I/O manager module 1112 allows data access to be managed and controlled from a single place within the remote control application. FIG. 7 depicts the file I/O manager objects, each will be discussed briefly below.

Parsers

The parsers 540 contain code to validate and parse the different file formats used by the remote control application. The parsers may be used mainly by the configuration engine 1110 to read and parse the different resources required to display information.

Serialization/Persistence

The serialization/persistence object 541 is used by the remote control application to read and write different file formats.

Device Configurations

The device configuration files 542 contain definitions of the devices the user has configured to be controlled via the remote control application. Each file may describe the contents and layout of various displayable pages for a device. These files may also contain any resources used to command the operation of such devices. Without limitation, the list of resources may include macros, IR codes, bitmaps, string literals and other data. A more detailed description of these file attributes are presented in later sections.

User Profiles

The user profiles 543 stores data about the different users of the remote control application which may include a user name, bitmap for a user avatar, user PIN, bit mask overlay and all preference settings. The results of adaptive learning (on a per-user basis) may be also stored in a user profile. Additionally, the user's favorite channel list (and associated network logos) may be stored here as well.

User IR Code Database

The user IR code database 544 is used to store supplemental IR codes downloaded from a Website or from some other source. The user IR code database may be separate from the standard IR code database shipped with the PDA 1150. The user IR code database may also contain learned IR codes.

Event Journal

An event journal 545 may be provided to contain a log of user and system actions that have occurred within the remote control application. The event journal may also contain broadcast messages received from devices within the home. The event journal is a log of what the user has done as well as what is happening within the home. It is contemplated that a user may be able to switch between a verbose mode and an alert mode. The event journal may also be used for debugging purposes.

System Features and Functions

The following paragraphs present detailed descriptions of individual features of the remote control application. In some cases examples of typical use are presented showing user input or other external action(s) or event(s) together with the associated response. It should be appreciated that such examples of typical use are intended to be illustrative only and, therefore, are not to be considered as limiting.

Setup Wizards

Setup wizards are parts of the application logic that guide the user of the remote control application through the steps to add devices to be controlled, configure user preferences, etc. The results of using a setup wizard may be saved into configuration files 542, 543 to be subsequently referenced by the remote control application when needed. In the discussions that follow, setup wizards will be divided into two general categories: user setup and device setup. A user setup wizard may be invoked to identify user(s) of the remote control application and their preferences. A device setup wizard may be invoked to establish the list of equipment that the remote control application may control and/or how the equipment should be controlled. A device setup wizard may also be used to gather information about which devices the remote control application may be operating. In this context, the overall initial setup process may be thought of as comprising four procedures:

(1) device identification;
(2) generation of macros (either via explicit entry or automatically);
(3) definition of favorites; and
(4) configuration of the home screen.

Setup wizards can be executed multiple times, for instance to add more users, add/change devices (to be controlled), add/change settings, etc. In an exemplary system, a setup wizard may detect if a particular setup has already been executed and display the current settings to the user for reference.

Platform Setup

Platform Setup—Device Identification.

To setup the remote control application platform, a device setup wizard may be invoked to setup the type(s) of devices the PDA 1150 is intended to operate (TV, DVD, DSS, AMP . . . ). This information may also include the manufacturer of a target device. To this end the user may be presented with one or more selections of IR codes and given the opportunity to test the different IR codes (i.e., cause transmission of IR code signals) from a selected manufacturer in order to determine which IR codes cause a target device to respond. Once the user has found and tested a successful combination, the device may be added to a list of devices available to be controlled.

Four different and well-known methods of device setup may be supported, namely, brand setup (described above); step and set (where the user tests the next IR code in a sequence of IR codes); direct entry (where the user enters a pre-determine code for the manufacturer/device type that is the intended target) and downloaded Web codes (where the user directs the remote control application to apply new IR codes gained through internet access). In the event RF communications are utilized between the PDA 1150 and devices, these same setup procedures may be utilized without limitation.

Once the correct command code set has been established by one of the methods described above, the remote control application may expose different levels of functionality (i.e., keys to command device functions) depending on the current user of the remote control application. By way of example, the user interface may be implemented with up to three levels of complexity. The default level is to expose standard level functionality, (i.e., a representative set of the most commonly accessed command functions for the device type and model configured). Alternative levels may include a power level, which exposes all command functions available within the remote control application library for the device type and model configured, or a simplified level, in which only basic command functions are exposed to the user for the device type and model configured. These, or other levels, may be offered to a user based on pre-set user parameters (e.g., as entered during user setup described hereinafter.)

Platform Setup—Generation of Macros

The remote control application may analyze the remote control application environment (i.e., the system comprising the setup devices) and, based on the knowledge of the user and the devices, the remote control application may be used to create one or more macros to automate repetitive device functions. By way of example, two common appliance functions, "Power Macro for Home Theater" and "Audio/Video Routing" are described in more detail hereinafter, although it will be appreciated that many other such opportunities for automated or semi-automated tasks may exist.

Power Macro for Home Theater

If all the appliances in a home theater system have discrete on/off codes, the remote control application can offer a global (Home Theater) on and off function. To that end, the remote control application may display a list of all available appliances (i.e., all appliances for which the remote control application has been setup to control) and the user may select the one(s) to be involved in the Home Theater Power macro. For example, the remote control application may present a list comprising DSS, Cable Box, Amp, VCR, DVD and TV. The user may select only Amp, DVD and TV to be switched on and off in unison as part of a Home Theater Power macro since the VCR may be independently activated to receive an input signal from the DSS and Cable box to record a program.

Audio/Video Routing

If the user routes all audio output via an amplifier, the remote control application can assist the user by ensuring that the correct audio input signal is used when the user selects a device to be the device in focus. This form of macro setup may be accomplished by asking questions during setup that are utilized by the remote control application to associate inputs with devices. Alternatively, the macro setup may be accomplished by utilizing information previously stored in Device Map 520 regarding device interconnections and input/output configurations. The macro(s) created as a result of the question/answer session may be customizable by the user to handle special situations.

Platform Setup—Favorites

The user may be able to specify a list of favorite channels for a number of categories. The favorites lists may be synchronized with the channel lineup offered by a cable or satellite service provider. During the setup of personal favorites, a user may specify a group (of channels) that they always want to cycle through. The channels selected for personal favorites do not need to be in the same category (i.e., be available from the same device). For example, a news favorite might include local broadcast channels while a movie favorite might include a cable channel. A personal favorites group may include a unlimited number of channels or may be limited in number to, for example, no more than seven entries in order to balance the time consumed in stepping through the channel possibilities against the amount of program material offered.

Platform Setup—Home Screen

Figure 11:
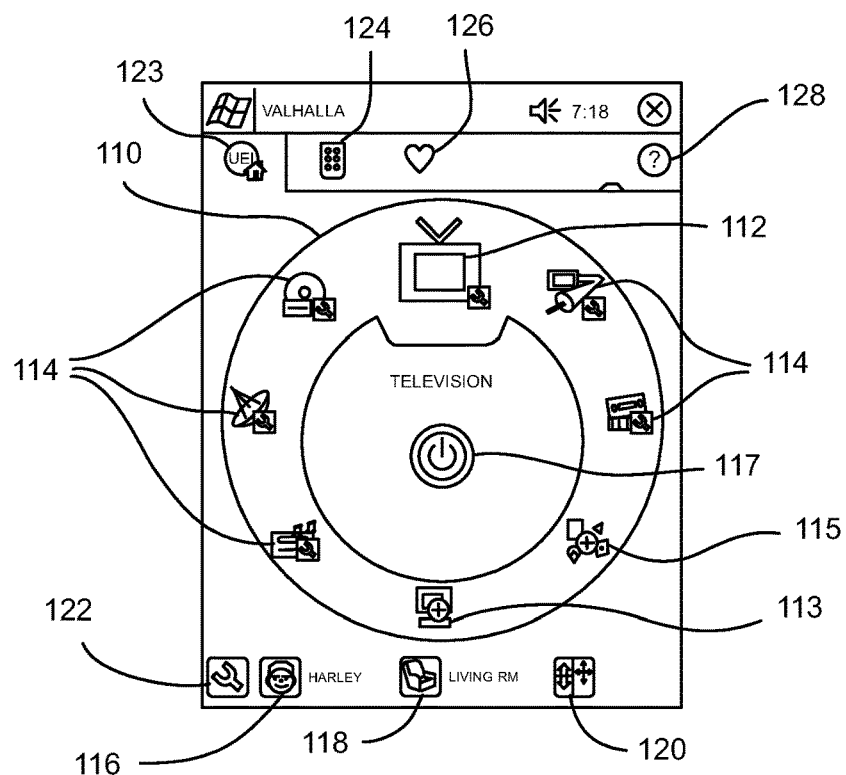
FIG. 11 illustrates an exemplary remote control application home screen with the remote control application configured to control the operation of consumer appliances.

Another setup option may allow the user to customize the remote control application home screen, an example of which is illustrated in FIG. 11. The remote control application home screen should not be confused with the initial (splash) screen that is loaded when the user starts the remote control application. In this regard, the remote control application home screen is the user's main portal to various device control screens or pages. During the setup of this home screen, the user may select whether to display control through a device-centric view, an activity-centric view or a mixture of the two, i.e., depending on the user's preference the home screen may list the devices, or it may list the activities that the user can perform, or it may list a combination of both. It is to be appreciated that an activity represents a desired configuration of one or more devices that is centered around a given pastime. By way of example, a "watch movies" activity might be setup to cause the transmission of commands to select the DVD player as the audio/video source, set the surround sound mode on the audio amplifier, switch the TV input to S-Video, etc.

Devices, activities, favorites, etc. that are not yet setup may be displayed on the remote control home page such that the iconic representation of the device, activity, favorite, etc. has an overlay, for example a wrench as illustrated in FIG. 11. The overlay indicates to the user that setup is required. In this regard, the icons function as soft keys that may be selected to cause the performance of a further action, for example, to display a device control page, cause the transmission of commands, etc. Additionally, if desired, the iconic representation of an un-setup appliance, activity, favorite, etc. may also be displayed in a different color (e.g., "grayed" so as to be displayed fainter than normal as gray-scale image). The overlay and/or graying may be removed once a setup procedure has been completed.

Setup may be automatically initiated in response to a user selecting a device, activity, favorite, etc. that has not been previously setup, i.e. selecting an icon with an overlay as described above may automatically invoke a setup wizard corresponding to the type of the selected icon. Initial execution of the remote control application may also detect that setup has never been performed and automatically invoke one or more of setup wizards (which may be chained one to the next in this instance) in order to establish a starting configuration for the remote control application. Still further, the remote control application may be pre-configured with a set of typical appliances, activities, etc. This set may, for example, be the most popular brand/model of each device type for the market or region in which the PDA 1150 was sold, may be a set of devices corresponding to a specific manufacturer or brand associated with the PDA 1150, or some combination of the above or any other criteria deemed appropriate.

Remote Control Application Start-Up and Home Page.

Figure 8:
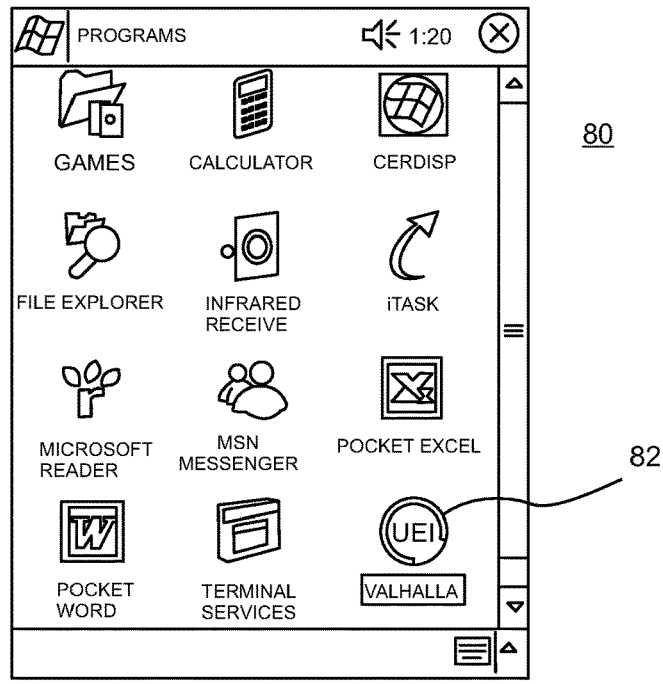
FIGS. 8 and 9 illustrate exemplary PDA display screens illustrating a resident or installed remote control application.
Figure 9:
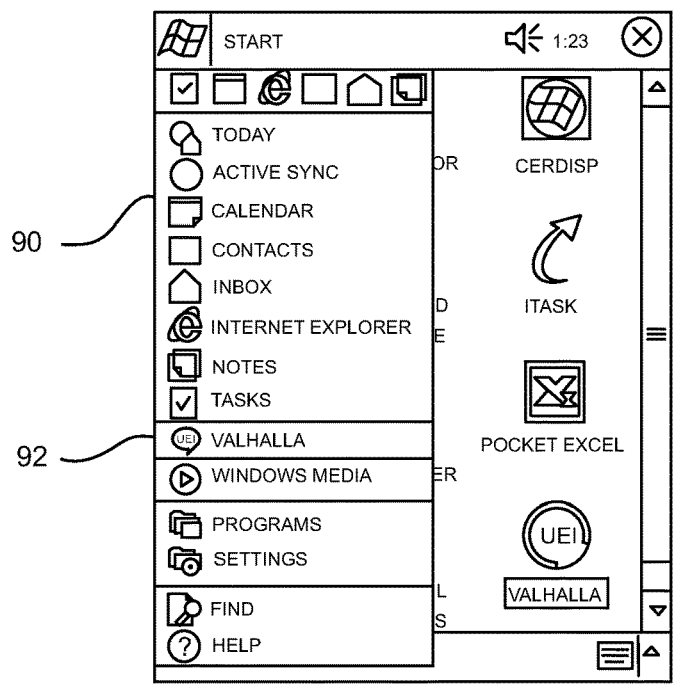
Figure 10:
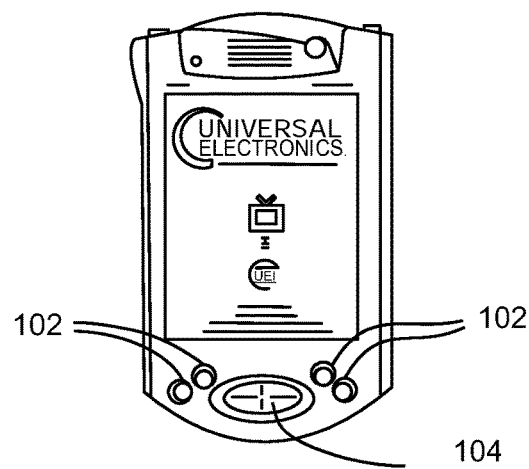
FIG. 10 illustrates an exemplary PDA physical appearance and layout.

FIGS. 8 and 9 illustrate exemplary display screens with programs installed on an exemplary PDA 1150 including the remote control application (labeled "Valhalla"). The user may initiate the remote control application by, for example, tapping the Valhalla icon 82 directly on the screen 80 or by selecting the Valhalla application 92 from a drop down start menu 90. When the remote control application is started for the first time it may display a splash screen such as illustrated in FIG. 10. The splash screen may include information such as product name and revision, company name, patent and copyright notices, etc. The splash screen may be OEM specific if desired. Alternatively, the remote control application, when staring from this initial state, may run a startup demo to show a quick overview of features of the remote control application. Once any splash screen display and/or demo are completed, the newly-started remote control application may load a default home screen with a suggested set of un-setup devices as illustrated in FIG. 11. Alternatively, an empty home screen with only the set-up icon 112/113 shown in FIG. 12 may be displayed. Still further, the remote control application may be pre-configured to start with certain predetermined devices already setup to be controllable as noted previously, for example, those of a particular manufacturer.

Icons representing devices and/or activities may be displayed in a wheel 110 that rotates to bring the selected device or activity to the top of the wheel. The top (primary) icon 112 may be displayed larger (48×48 pixels in an exemplary embodiment) than the other icons 113, 114, 115 (24×24 pixels in said exemplary embodiment). Additionally, an intermediate size (36×36 pixels for example) may be provided for display of secondary devices. The spacing of the icons may be dynamically calculated based on number of icons, to provide even spacing around the wheel 110.

In the example illustrated in FIG. 11, indication is made to a user that devices are in need of being setup, for example, by overlaying a wrench symbol over the standard device icon. Devices that are set up may float (i.e., be moved so as to be positioned) near to the top of the wheel 110. By interacting with the wheel 110, the user may select a primary device 112 to initiate setup, or select another icon 114 to become the primary device. When another icon 114 is selected, the wheel may perform intelligent rotation turning in the direction that moves the desired device to the primary position—the wheel top—quickest.

Figure 12:
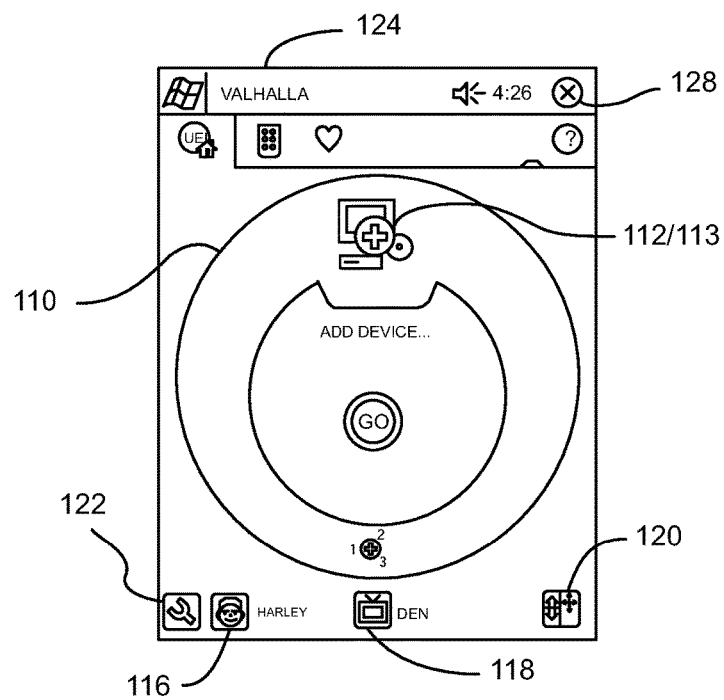
FIG. 12 illustrates an exemplary remote control application home screen prior to the remote control application being configured to control the operation of consumer appliances.

The home page display shown by way of example in FIG. 11 or 12 may also include indication of the current user 116 and current room 118. As will be described later, the icons representing the user and room may also be used to invoke configuration menus for these items. A default user name may be taken from the PDA 1150 owner information. In the example shown in FIG. 11 (i.e., with suggested devices to setup already displayed on the wheel, a default room is shown as the "Living Room" which includes the devices: TV, DVD, Cable Box, VCR, Satellite, Audio Receiver).

The home page display may also include a KeyGuide icon 120 which initiates a display of the current assignments of the hard keys of the PDA 1150 and/or allows altering these assignments, an icon 122 to initiate a customization menu, and icons 124 and 126 to switch to other display pages; all of which will be described in more detail hereinafter.

Device Setup

In order to control devices, the user may be required to first identify to the remote control application the manufacturer and IR code used by each device, as well as associating any desired special features (display name, macros, etc.) with the device. In general, device setup comprises performance of one or more of the following steps:

1) The user selects a device icon to set up.

2) The user selects a device type. (In some cases, this may comprise simply confirming that the device type desired matches the displayed icon that was selected.)

3) User specifies the device IR format and command set to be used to control the selected device. This, in general, may occur in one of several ways: the user may directly specify a desired setup code by number, the user may search through all codes available (local and/or downloaded from Web Hosted Services), the user may select a brand name from a list presented by the remote control application (and may test various versions of that manufacturer's IR codes if multiple possibilities exist), or may use such other technique as may be appropriate.

An exemplary setup process will be described in more detail in the paragraphs that follow.

Referring once again to FIG. 11, the device wheel 110 is shown with all devices requiring setup. In addition, an add device icon 113 and add activity icon 115 are presented. The device wheel 110 of FIG. 11 represents an example of one starting view of the device wheel 110 when a user starts the remote control application for the first time. By way of example, the steps involved in setting up a TV using a brand name will be detailed. The user begins by touching the TV icon 112 (or pressing the power button 117 or selecting a hard key such as the navigation pad 104, etc.). By way of explanation, during normal operation (i.e., after the remote application has been setup for the device), touching the device icon would cause the remote control application to display a page of control functions for that device (for example, see FIG. 19*a*). However, in this case, since the device has not yet been set up (as indicated by the small wrench icon overlaid on the main TV symbol), the setup wizard depicted in FIGS. 14a through 14i is invoked. As an alternative (for example in the case where a TV device has already been set up and the user wishes to add a second TV, or where the user wishes to add a device not shown on the default wheel) the user may select the add device icon 113.

Figure 14A:
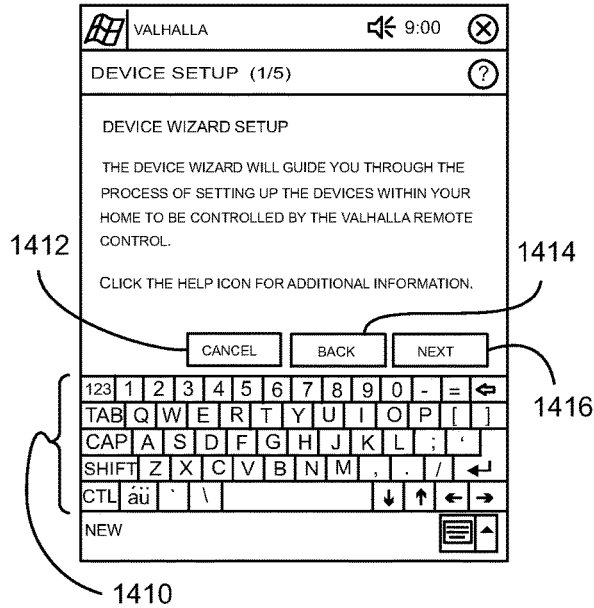
FIG. 14 illustrates an exemplary series of steps to set up the remote control application to command the operation of a new consumer appliance.
Figure 14B:
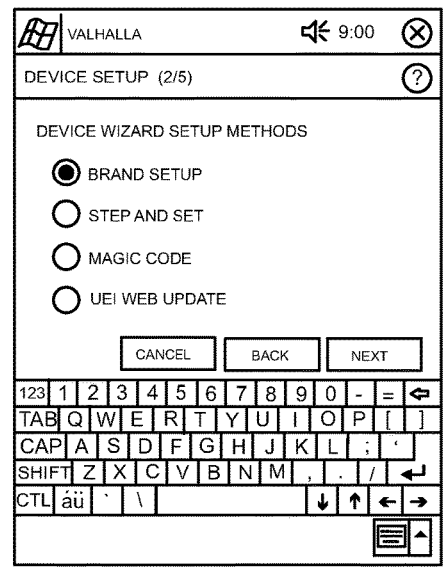

The device setup wizard for TV setup may begin with an introductory message as shown in FIG. 14a. Also, a keyboard 1401 and cancel 1412, back 1414 and next 1416 buttons, for use in connection with the setup wizard, may be displayed. In general, the keyboard and buttons can be displayed throughout each setup wizard page and occupy the same position on all the screens for ease in use. Once the optional help message has been read, the user would press the next button 1416 which steps to the exemplary screen shown in FIG. 14b. The user may then select which setup method he wishes to use. In the example illustrated, the default setup method—brand setup—is already selected and the user simply presses the next button 1416 to proceed to use this setup method. Other methods of device setup, for example, code searching, direct entry, etc., are also available and are well known in the art—see for example U.S. Pat. No. 4,959,810, 5,614,906 or 6,157,319 all of which are incorporated herein by reference in their entirety.

Figure 14C:
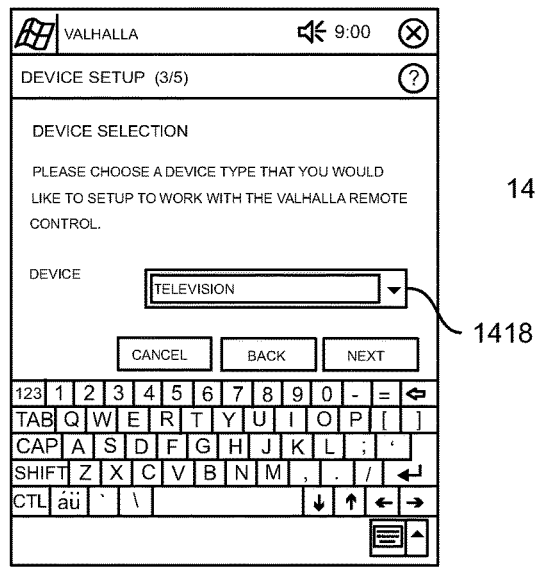
Figure 14D:
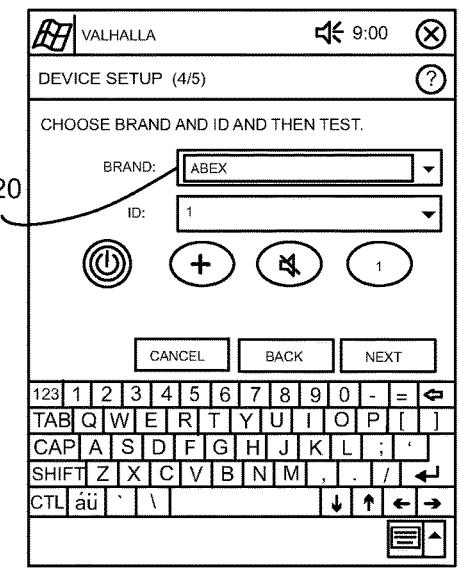

To perform device setup in accordance with the step illustrated in FIG. 14c, the user selects the device type (TV in this example) from a drop-down menu 1418 of all device types supported by the remote control application. Then, as illustrated in FIGS. 14d and 14e, the user may be presented with a drop down list of brand names 1420 which correspond to the device type selected. The user may navigate this list using the up and down arrows 1422, slider 1424 displayed at side of the list, or any other conventional GUI device. Furthermore, for rapid positioning to a general area within the drop down list, the user may use the keyboard 1410 to type in the starting letter(s) of a brand name. Once the brand name has been highlighted (e.g., "Sony" in FIG. 14e), the user can indicate a desire to choose that brand by selecting (e.g., by tapping) the next button 1416. Additional GUI techniques for choosing a brand of choice are also contemplated.

If multiple IR code set possibilities exist for the brand selected, the user may be presented with the opportunity to test each possible IR code set using a drop down menu 1430 in connection with a displayed set of test function keys 1432 as shown in FIG. 14f. Test functions 1432 may or may not be displayed with text labels indicating their designated functions—the example 1432 shown in FIG. 14f is without labels while the example shown in FIG. 20b includes keys with text function labels. The user may activate one or more of the test function keys 1432 to see if they function to control the device as desired (i.e., in response to their activation an IR command code from the selected set is transmitted to test if the target device responds). If the target device fails to respond as anticipated, the user can simply select a different code set number from the drop down list 1430 and repeat the test procedure (e.g., activate the test function keys again). When the correct setting is found (i.e., the device responds as expected), the user can press the next button 1416 to continue with the setup procedure.

Figure 14I:
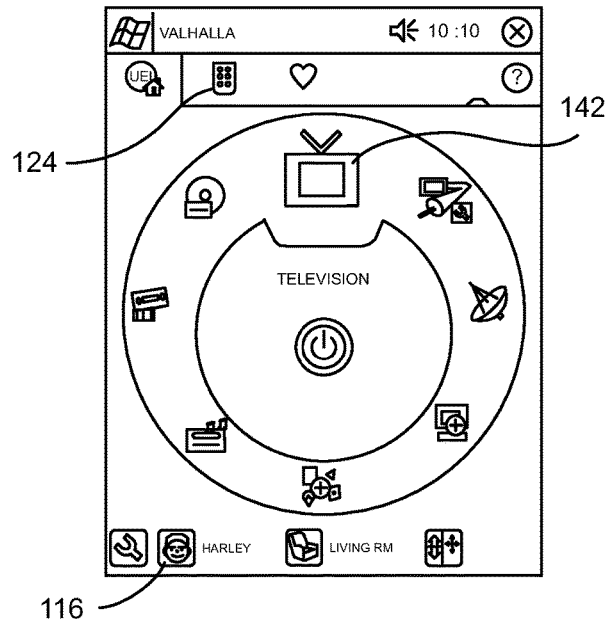

Optional steps illustrated in FIGS. 14g and 14h allow the user to enter a tag name for the setup device. A default name, as shown in FIG. 14g, can be a simple concatenation of the brand name and the device type. The user may, however, elect to use a more descriptive name of their choosing, as shown in FIG. 14h. Tapping next button 1416 may then be used to complete the device setup wizard process. The resultant TV device icon 142 would then be displayed on the wheel 110 (sans wrench overlay) together with the user-entered device name as illustrated in FIG. 14i. Alternatively, an additional step may be included to allow the user to select a customized icon to represent the device.

User Profiles

Figure 15A:
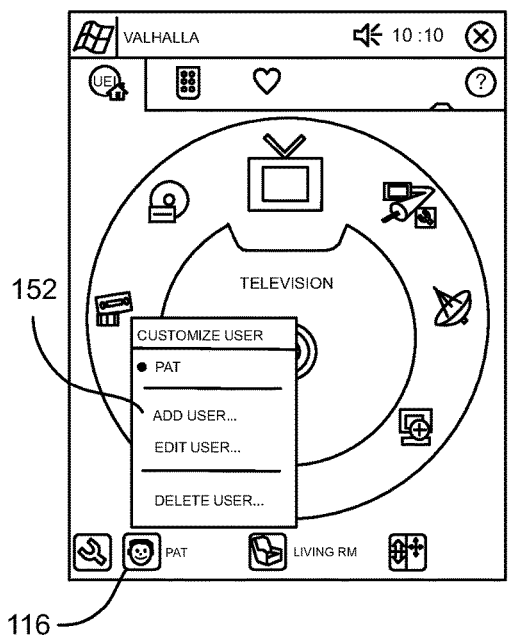
FIG. 15 illustrates an exemplary series of steps to set up a new user of the remote control application.

Exemplary steps for setting up a new user profile are illustrated in FIGS. 15a through 15f. With reference to FIG. 15a, user customization may be initiated by tapping the current user icon 116 which results in the display of a customize user menu 152. The customize user menu 152 may be used to select a user—to place the remote control application in a mode to control devices, perform activities, etc. that have been associated with the selected user (in the example illustrated in FIG. 15 only one user, "Pat," is currently defined), to add/delete a user, or edit the profile of an existing user. By way of example, the steps involved in adding a user will be illustrated. It will be appreciated that process of editing the profile of an existing user could be very similar.

Figure 15B:
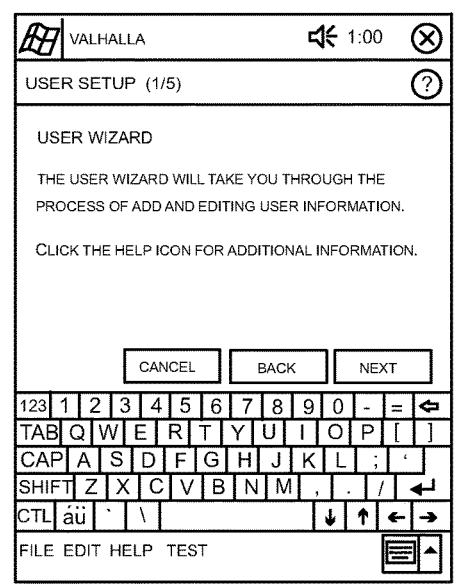
Figure 15C:
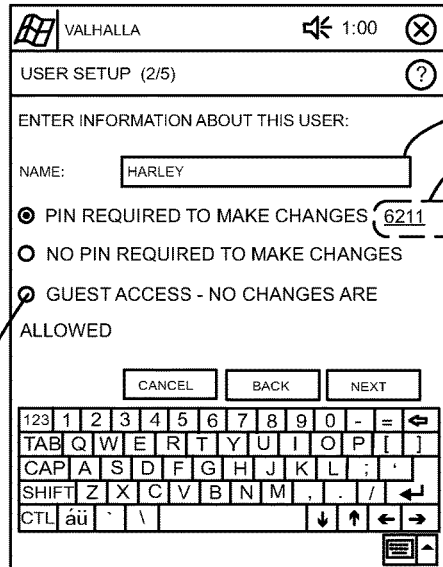

A user setup wizard could be invoked by selecting "add user" from the customize user menu 152. The user setup wizard may commence by displaying an introductory message as illustrated in FIG. 15b. The user setup wizard may then prompt, as shown in FIG. 15c, for entry of a new username 1510 and, by way of example only, an optional password or personal identity number (PIN) 1520 which would be needed to authorize future changes to the profile being setup. In the example illustrated, this user setup wizard page also permits the new user to be defined as a "guest" via checkbox 1530. If set, guest status preferably disables all setup and customization functions (device, user, room, favorites, etc.) within the remote control application while this user designated as a guest is active. Guest status may also be used to inhibit access to other applications of the PDA 1150 such as, by way of example, calendar, address book, spreadsheet, etc. The inhibit function may be implemented on a global basis—i.e., the guest user is prevented from exiting the remote control application—or may be on a per-application basis, depending on the level of support available within the PDA platform.

Figure 15D:
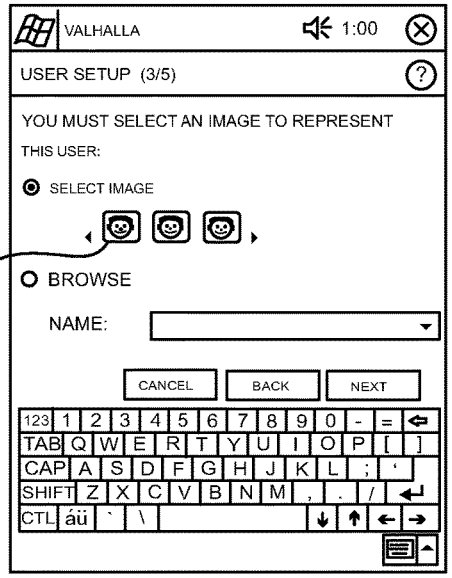
Figure 15E:
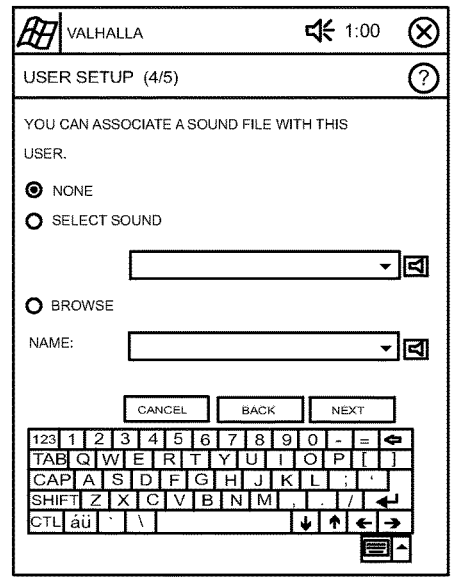

Once the name and any PIN or special status has been entered during user setup, an icon can be selected to represent the new user (as illustrated in FIG. 15d) and a sound may also be assigned to provide an audible indication when switching the remote control application for use by that user (as illustrated in FIG. 15e). To select an icon, the user may scroll through a list (for example presented as a strip 1534) of predefined user images (which may alternatively be presented as a drop-down list, etc.), browse through bitmaps and select an image from a file folder within the PDA 1150, download an image, etc. Similarly, the user may select a sound from a drop down list of predefined sounds, browse through all audio (e.g., .wav files) stored in the PDA 1150, download an audio file, etc.

Figure 15F:
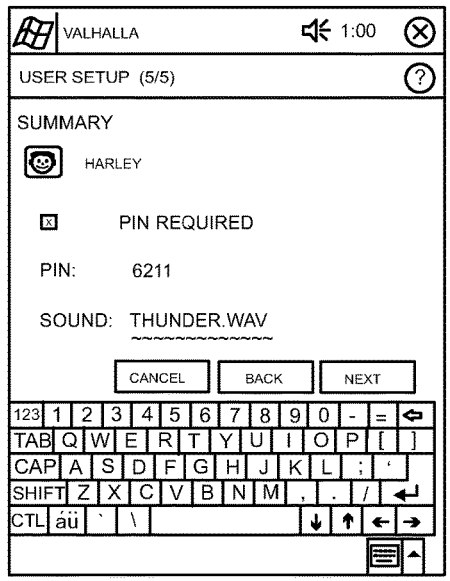
Figure 16A:
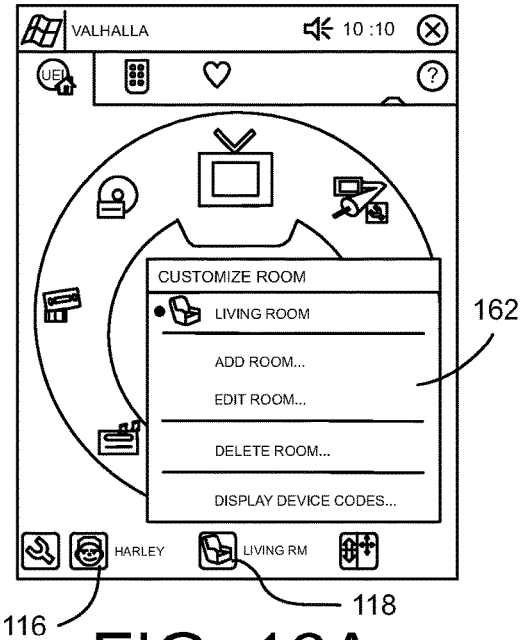
FIG. 16 illustrates an exemplary series of steps to set up the remote control application to command the operation of consumer appliances in a designated room.
Figure 16B:
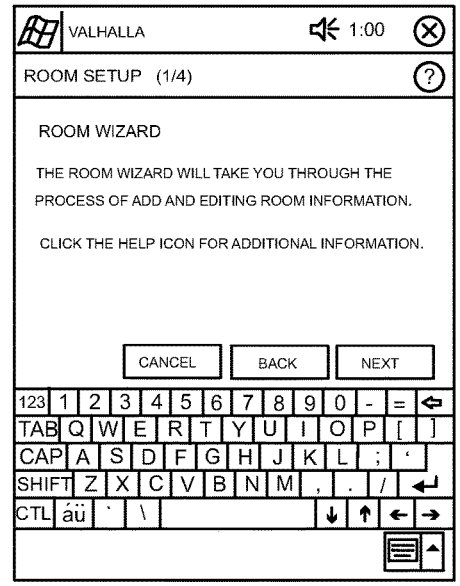
Figure 16:
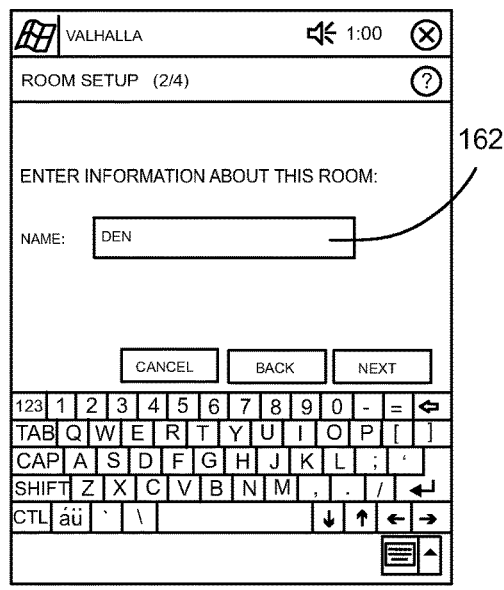

To conclude the user setup process, a confirmation screen may be presented, as illustrated in FIG. 15f. Tapping the next button 1416 on this confirmation screen may then return the remote control application to the home page display with the new user (e.g., the selected "Harley" icon shown, for example, FIG. 14i or 16a). The initialization of a new user in the manner described above can also result in the creation of a new, blank favorites page that would be assigned to this user. The purpose and configuration of the favorites page will be discussed in detail in a later section.

Room Profiles

An exemplary process for configuring a room profile is illustrated in FIGS. 16a through 16f. Room profile configuration may be commenced, with reference to FIG. 16a, by, for example, tapping the current room icon 118 which results in the display of a customize room menu 162. The customize room menu 162 allows the selection of a different room—to place the remote control application in a mode to control devices, perform activities, etc. that have been associated with the selected room (in the example illustrated only one room, "Living Room," is currently defined), the addition/deletion of a new room, or editing the profile of an existing room. For configuration purposes, the customize room menu 162 also includes the option to display the device code setup numbers for all devices currently configured in the selected room. The device code setup information may be useful, for example, when accessing Web-based services which provide extended function codes for devices, and are not supported by automated or semi-automated processes. (For additional background regarding semi-automated Web-based services, the reader is directed to co-pending application Ser. No. 10/151,501 "System and Method for Upgrading the Remote Control Functionality of a Device," which is incorporated herein by reference in its entirety.) By way of example, the steps involved in adding a room will be illustrated. It will be appreciated, however, that editing an existing room might be a similar process.

Figure 16D:
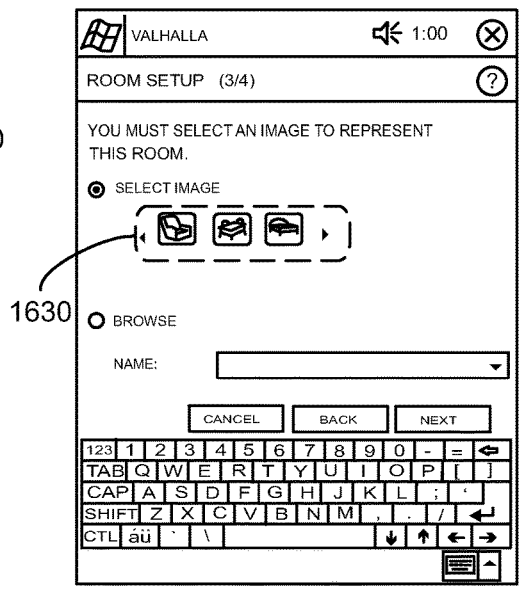
Figure 16E:
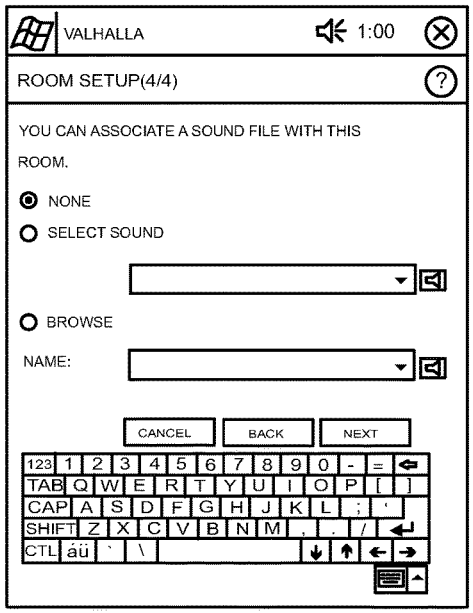

To invoke the room setup wizard, the "add room" item could be selected from the room customization menu 162. Upon being invoked, the room setup wizard may begin by displaying an introductory message shown by way of example in FIG. 16b. The room setup wizard may then prompt for the entry of a name 1620 for the room, as illustrated in FIG. 16c, and an image to be associated with this room, as illustrated in FIG. 16d. To select an image, the user may scroll through a list (e.g., a strip as shown, a drop-down list, or other-like GUI selection device) of pre-defined room images 1630, may browse through bitmap images in file folders within the PDA 1150, download an image, etc. The user may also optionally associate a sound with switching to that room, as illustrated in FIG. 16d. Again, the user may select a sound from a drop down list of predefined sounds, may browse through sound files (e.g. .wav files) stored in the file system of the PDA 1150, download an audio file, etc.

Figure 16F:
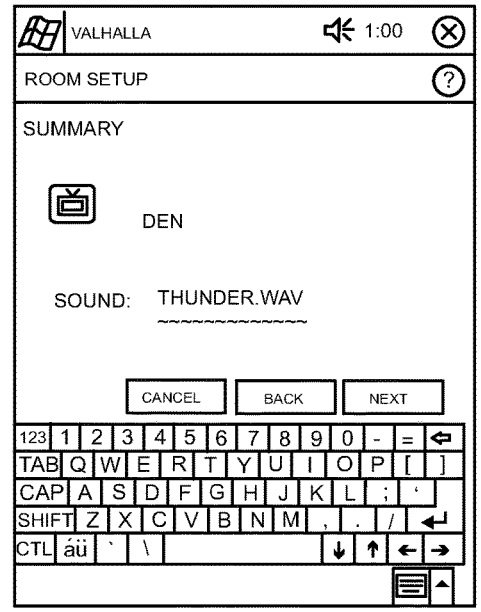

A confirmation screen may be presented to indicate that the room setup process is complete, as illustrated in FIG. 16f. Tapping the next button 1416 on this confirmation screen could then return the remote control application to a home page display with the new room "Den" selected and an empty wheel 110 ready to be configured for the devices and/or activities to be associated with the newly-defined room mode, as shown, for example, in FIG. 12. The initialization of a new room in the manner described above may also results in the creation of a new, blank favorites page that would be assigned to that room (and user in that room if appropriate). The purpose and configuration of the favorites page will be discussed in detail in a later section.

Room Setup—Phase 2—Generation of Macros

Figure 16G:
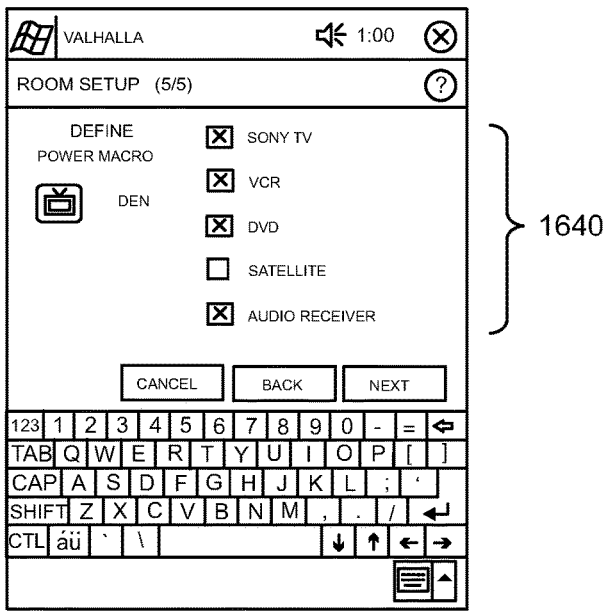

The remote control application may also provide for the automatic or semi-automatic configuration of macros (pre-programmed sequences of command actions which may be played back by pressing a single key) for common activities. By way of example, an often needed sequence of commands may be the powering on (and off) of several appliances together, such as may be case with a home theater system. To facilitate creation of this type of exemplary macro, the remote control application may, as part of a setup wizard, display to the user a list of all currently configured devices 1640 accompanied by "checkboxes" in which the user may indicate which of these are to participate in an "all on" macro. This may be included as an additional step in the room setup wizard, as illustrated in FIG. 16g, since such macros will generally be associated with the devices available in a particular room.

By way of further example, another often needed sequence of commands may be those that perform input routing. To configure a macro to perform input routing, the user may answer a series of questions about the manner in which devices are hooked-up, may select a device hook-up configuration from a list (or from a list with visuals/diagrams), etc. Alternatively, where the underlying graphics capability of the device 1150 supports it, a drag and drop interface may be provided to match the inputs and outputs of different devices that is representative of the manner in which the devices are hooked-up. Each of these input/output pairs may then be used to establish a macro sequence to perform input routing so that, when a particular device is selected for use, all of the requisite audio/video controls are automatically selected or set to allow said use.

Customization of Home Screen

The system may allow the user to customize the appearance and functionality of the home page by, for example, adding a customized background, displaying only devices or only activities on the wheel 110 (the default may be to display both types, intermixed in the order in which they were set up), limiting access to setup functions, etc.

Initialization of the Remote Control Application and Interaction with Other Applications.

Figure 24:
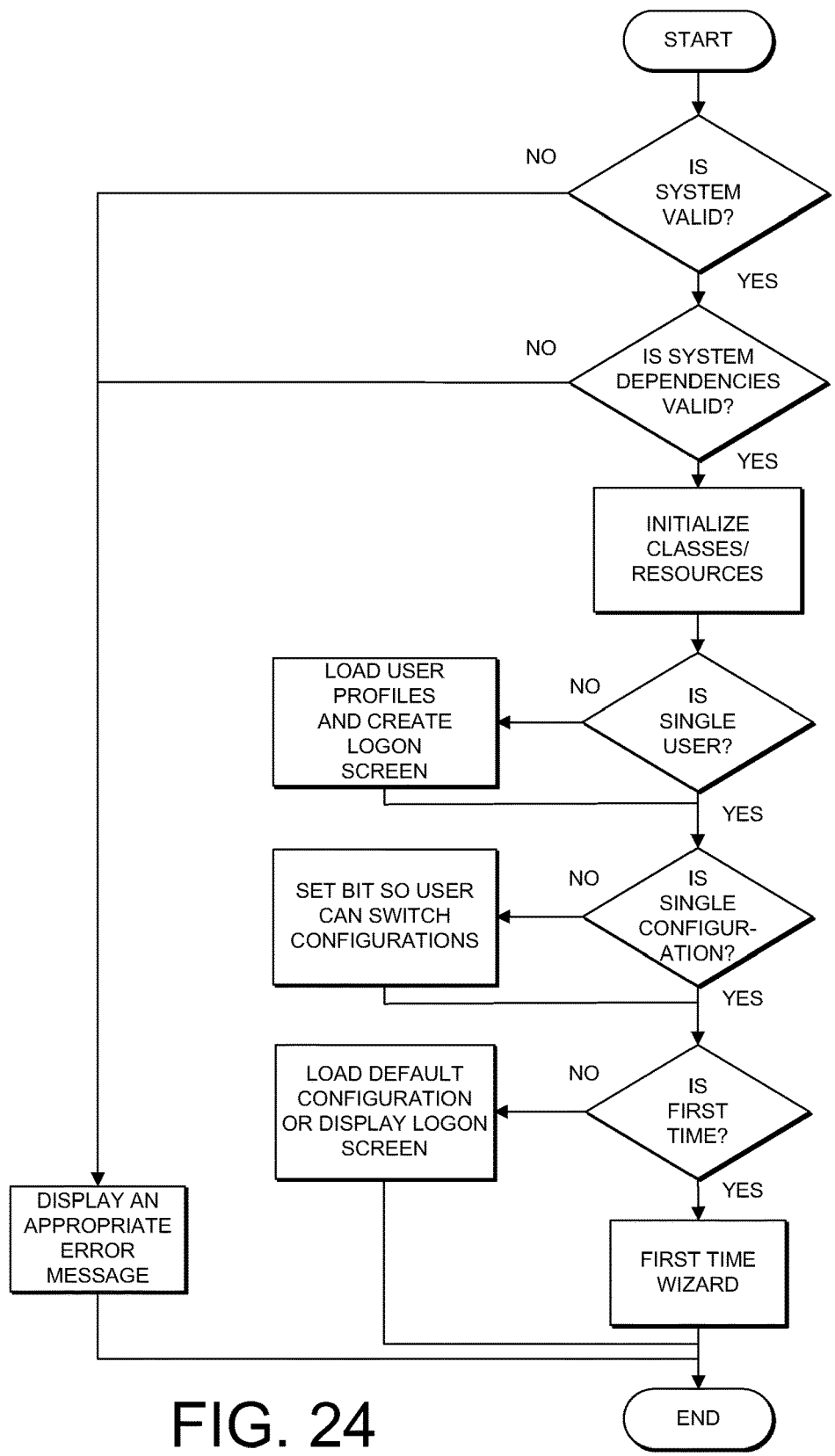
FIG. 24 illustrates an exemplary start-up initialization sequence for the remote control application.

The remote control application may have basic behavior as it is turned on and off. By way of example, an initialization sequence may be performed when the remote control application is started. An overall view of a typical initialization sequence is shown in FIG. 24. In the illustrated example, advantage is taken of the hardware and software provided by the iPAQ brand PDA to integrate seamlessly with the Windows Pocket PC 2002 brand software system. The basic initialization behaviors of this exemplary platform are described in the following paragraphs, together with the interactions with other parts of the PocketPC brand software system.

When a user selects the remote control application icon from the "programs" or "start" screen display (illustrated in FIGS. 8 and 9), an internal consistency check is preferably performed to ensure that the files and resources needed to operate the remote control application are available. If a file is missing, for example, the user may be informed that they need to re-install the file or an application. If problems persist, a message may be displayed to inform a user that technical support should be contacted. A dependency check may also validate that the required hardware (e.g., an IR signaling module 1118 or transmitter IC 204) is available and that it is the correct version for the remote control application and other software currently installed. In the Class Initialization, individual modules may be initialized to a default state before a configuration file is loaded. In the resource initialization, the base resources required to guide the user through the first time wizard may be loaded. The resources include the IR database, icons, bitmaps, dialogs, etc.

Thereafter, all required system resources are initialized, the remote control application selects the appropriate start-up user and room (if multiples are configured). The system may check to see if the system is multi-user or single user. If the system is single user, the multi user login may not be created. If the system is multi-user, the system may load the user profiles (including user name, user icon, user PIN and which configuration file the may use). If the system is single user, the system may check to see if the user has one or more configuration files. If there is only one configuration file, then that configuration file may be loaded. If the user has more than one configuration file on the system, the system may load the configuration file which is specified as the default. The default may be the last configuration file used on the system. The system may set a bit so the system can provide a method to allow the user to (choose from and) load any other configuration files. If the first time user wizard flag is set, the system may gather information about the user. If a configuration file is already on the PDA 1150, then the user may be prompted to use that one or create a new one.

Upon successful initialization, a splash screen may also be displayed, an example of which can be seen in FIG. 10. The splash screen may include information such as the product name, company name, legal information, including patent and copyright notices, etc. This splash screen may require user identification and/or log in or may simply switch to a home screen after a time out. In either case, on completion of the splash screen activity the remote control application would be the application in focus. While active, the remote control application may temporarily override the standard assignments of any hotkeys—as described in more detail in other sections of this document.

When the remote control application is active, if the user performs no action within a timeout period (e.g., 20 seconds which time may be user settable) the system may turn off the display in order to conserve battery energy. However, even though the display is turned off, the application in focus may still be the remote control application. The display may be caused to briefly switch back from the home screen (or whatever other screen is currently being displayed) to the splash screen as warning that a time out is about to occur.

If the user selects another application supported by the PDA 1150, for example, a Pocket Excel brand spreadsheet application, the remote control application may continue to execute in the background but would no longer be the application in focus. In this case, the remote control application may be reinstated as the application in focus by the user selecting a hotkey (e.g., the iTask button), which hotkey would again be active because the remote control application is not in focus, or by re-selecting the remote control application from the start menu or programs page. In the case where the remote control application is reinstated, the remote control application may not perform the complete initialization sequence described above. Rather, since the remote control application is already loaded and active, it may simply resume at the point at which it was suspended.

Favorites Page(s).

Figure 17A:
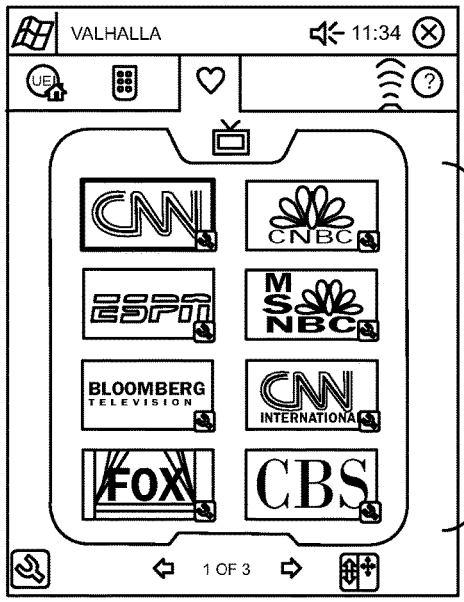
FIG. 17 illustrates an exemplary series of steps to set up a new remote control application favorite channel soft key.

The remote control application may provide one or more favorites pages containing button icons which the user may configure for direct access to his favorite programming (e.g., example, to cause the transmissions of commands to cause a device to tune to a favorite channel), favorite device, etc. Access to such favorites pages may be, for example, via an icon 126 on the home screen page illustrated in FIG. 11. An exemplary favorites page is illustrated in FIG. 17*a*. A favorites page may be optionally pre-populated with a selection 1710 of commonly requested content providers (e.g., using their logos) as shown in FIG. 17*a* or may initially be blank. Initialization of the default favorites page in either case preferably occurs on first start-up of the remote control application. Separate, additional favorites pages may be created when users and/or rooms are added as described earlier. It will also be appreciated that favorites pages may be specific to particular devices (e.g. a satellite STB or a CD jukebox) while in other instances favorites pages may span multiple devices in order to allow access to all of a user's favorite media content from a single point of access.

Figure 17B:
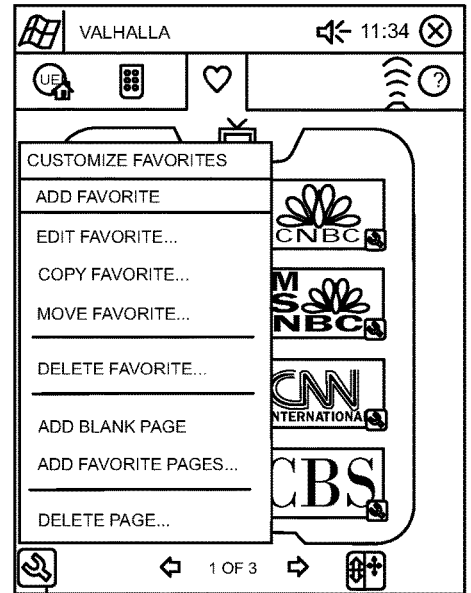

In the case where the initial favorites page is pre-populated, icons which have not yet been configured by the user may be displayed with an indicia that setup is necessary (e.g., using a wrench overlay as seen in FIG. 17*a*). In order to configure or add a favorites icon, the user may either invoke the customize favorites menu (instantiated, for example, by tapping the customize icon 122 while a favorites page is displayed) and selecting "Add Favorite" or "Edit Favorite," as illustrated in FIG. 17*b*, or may simply tap one of the default icons that is displaying the wrench overlay to indicate that it is not yet configured. In either case, a favorites setup wizard may be invoked to configure a favorites entry as described in the following paragraphs with reference to FIGS. 17*c* through 17*h*.

Figure 17C:
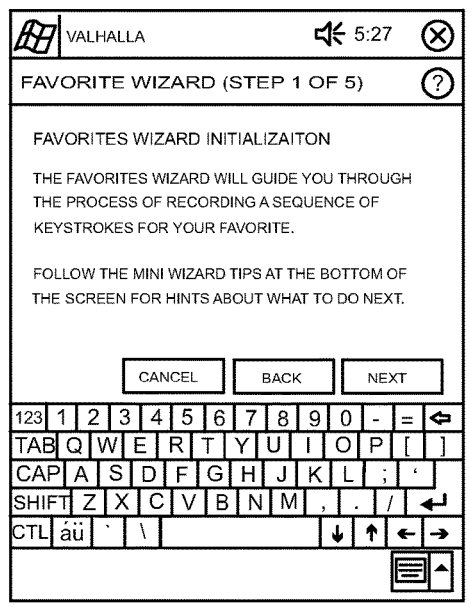
Figure 17D:
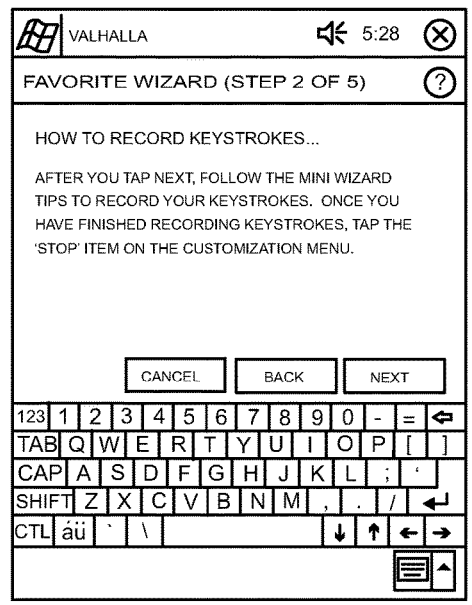
Figure 17E:
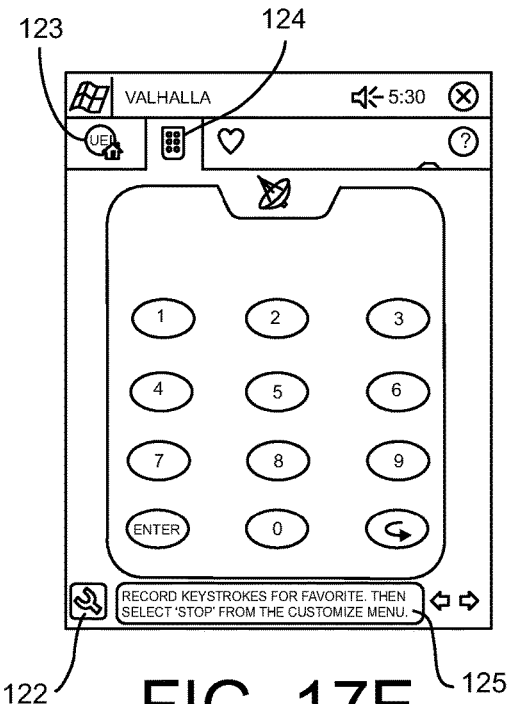
Figure 17F:
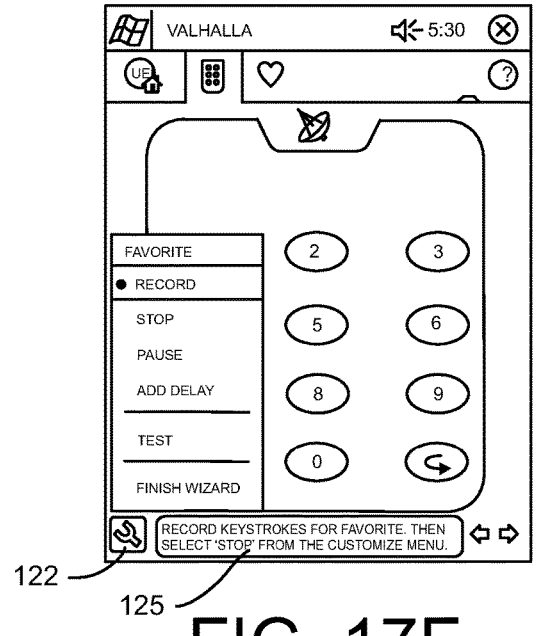
Figure 17G:
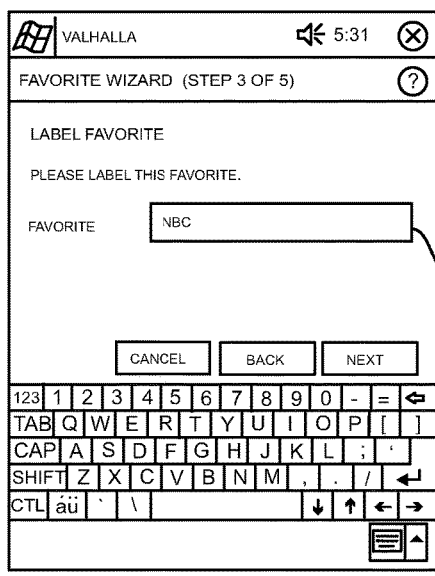
Figure 17H:
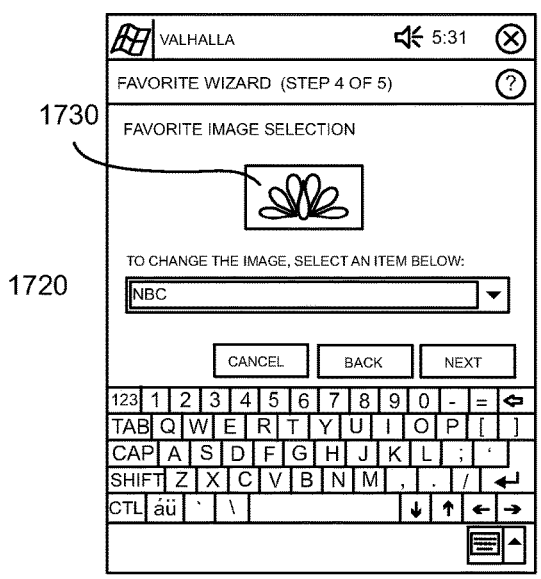

The favorite setup wizard may begin by displaying the introductory message shown in FIG. 17*c*. Next, the favorites setup wizard may instruct the user, as shown in FIG. 17*d*, to record a sequence of keystrokes or other actions which are to be associated with the favorites entry being configured. When the user taps the next button 1416, the user may be presented with the normal set of device control pages such as, for example, the satellite device control page shown in FIG. 17*e*. The user may navigate amongst all the devices that have been configured using the home page wheel 110 (the home page is accessed via selecting icon 123) to switch to individual device control pages using icon 124. By this means the user may enter a series of keystrokes, for example, selecting the keys "0," "0," "4," and "Enter" to assign to a favorites button commands for switching the satellite receiver device shown in FIGS. 17*e* and 17*f* to channel four. In an exemplary system, a "mini-wizard" (evidenced by the guidance messages 125) may continue to guide the user through the setup process while still providing full access to the soft key pages within the application interface of each device. When the user has completed entry of the desired sequence, tapping the customize icon 122 displays a menu which allows the user to complete the final steps of the favorites setup wizard. From this exemplary menu, the user also has the option of temporarily suspending and later resuming recording of keystrokes, inserting a delay into the playback sequence, or testing the sequence entered so far by playing it back. The final steps of the favorites setup wizard, illustrated in FIGS. 17*g* and 17*h*, allow a name 1720 and image 1730 to be assigned to the favorites entry. A sound may also be associated with selection of the favorite entry. Furthermore, where supported by the underlying PDA platform, additional data such as, for example, a URL to be loaded automatically into a concurrently running browser application, may be associated with the favorite entry. (For additional background regarding use of such data in conjunction with a user definable favorite key, the reader is directed to co-pending application Ser. No. 10/176,315 entitled "System and Method for Retrieving Information While Commanding Operation of an Appliance," which is incorporated herein by reference in its entirety.)

Navigation Model

The remote control application may take advantage of the hardware keys offered on the PDA 1150 by redefining functions associated with these keys while the remote control application is active. By way of example, referring to FIG. 10, the exemplary iPAQ brand PocketPC devices offer four hard keys 102 plus a navigation pad 104 (up/down/left/right and select) arranged across the bottom of the unit. During normal operation these key would typically be assigned by default to perform various quick functions such as switching directly to a calendar or address book applications, displaying a list of currently active applications (sometimes referred to as using the "iTask button"), navigating directories or menus displayed on the screen, etc. When the remote control application is active, such hard keys may be defined to, among other things, cause the remote control application to perform actions that are related to commonly used device control functions. This functionally may be further enhanced by allowing the user to select between various groupings of hard key assignments based on their current activities. For example, optimum convenience during navigation of a menu on a PVR device may require that these keys be configured to cause the transmission of commands for direction control, menu, exit, and selection functions; while optimum convenience while watching a DVD may require that these keys be configured to cause the transmission of commands for transport control functions (play/pause/fast forward, etc.).

Figure 13:
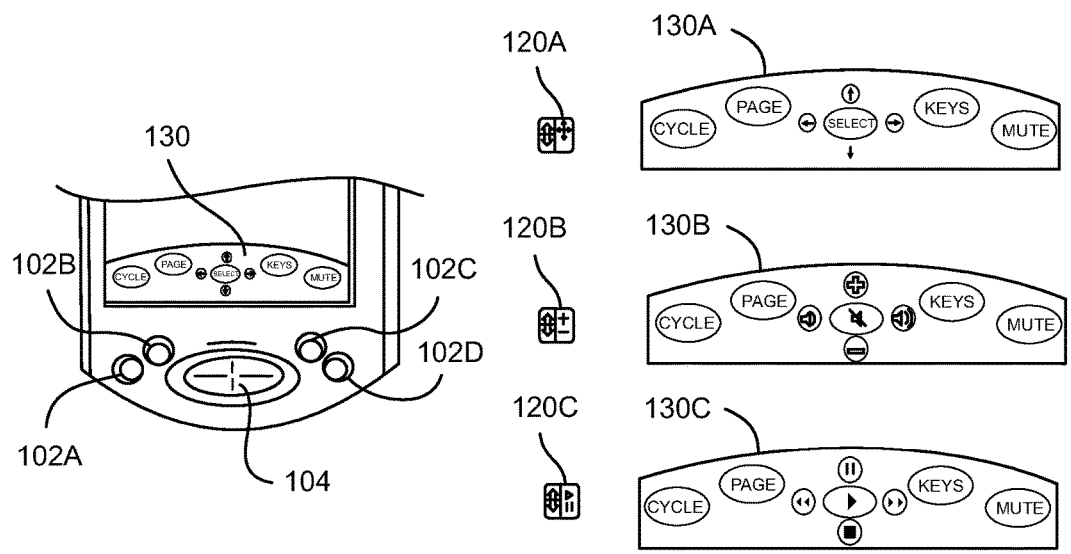
FIG. 13 illustrates exemplary remote control application hard key function assignments on a PDA together with corresponding informational displays.

The various aspects of this hard key reassignment model and user control over it will be discussed in the following paragraphs in conjunction with FIG. 13. These models include, but need not be limited to:

An exemplary application navigation model, which is driven by the four hard keys 102;

Exemplary multiple navigation pad 104 key assignments, which can be navigational, control, or transport;

An exemplary method for displaying a key guide to indicate current key assignments; and An exemplary method for selecting the active navigation pad key assignments.

Application Navigation

Button 102a can be used to cause the remote control application to cycle through each page type, e.g., home screen page, device control page (for a currently active device—the one at the top of the wheel), a favorites page, etc., as represented by the tab icons 123, 124, and 126, respectively, across the top of the screen illustrated in FIG. 11. If button 102a is pressed when the application is active, but in low power state, the current page may be displayed. In this instance a second press may cycle to the next page type. Button 102b can be used to cause the remote control application to display the next page for this page type (for example, control may be comprised of four pages, favorites comprised of three pages, etc.). If button 102b is pressed when the application is active, but in low power state, the current page may be displayed. In this instance a second press may cycle to the next page within the family of pages for this page type.

Button 102d can be used toggle mute (e.g., cause the transmission of a mute toggle command to an appliance in focus). This button may be made always available, regardless of the assignments selected for the other keys in the group.

Button 102c can be used to display a key guide 130 and allow a user to change key assignments for the navigation pad 104. When pressed initially, the current key guide may be displayed, for example, overlaid over the bottom of whatever display page is currently active, as illustrated in FIG. 13. Display of the key guide 130 may be for a fixed or user-settable period of time, e.g. five seconds. If button 102c is pressed again within this time window, i.e. while the key guide 130 display is visible, navigation pad key assignment configurations can be cycled through. By way of example, three possible selectable configurations 130a, 130b and 130c are shown. The significance of these assignments is discussed in more detail in the following paragraphs.

Navigation Pad Key Assignments

For user convenience, the five key functions present on the navigation pad 104 (up, down, left, right, and select) may be assigned to one of several groups of function according to an activity currently being performed. This assignment may be changed dynamically and automatically by the remote control application according to the device type currently selected or activity currently being performed, or it may be manually set by the user. In the illustrated example, three sets of functions are available: navigation 130a (for menu or guide operations on consumer appliances), control 130b (volume and channel up/down), and transport 130c (play, rewind, fast forward, etc.). It will be understood that activation of the navigation pad 104 would then result in the transmission of commands to control the appropriate operation of the intended target device.

An indication of the current setting of these keys is presented in the lower right corner of the screen by the key icon 120. This icon may take different forms 120a (indicating navigation), 120b (indicating control) and 120c (indicating transport) depending on the current setting of the navigation pad hard keys. Tapping this icon 120 may invoke a menu from which the desired key assignment can be selected by the user. Alternatively, key assignments may be changed by use of the hard key 102c as described earlier.

In the case where a user attempts to change the hard keys to a mode that is not supported by the device selected for control, transport functions when the remote control application is in a mode to control the operation of a television, the remote control application can prohibit selection of that key assignment, can allow selection of that assignment with the resulting activation of the hard keys resulting in the no action being taken place by the system (or to cause transmission of signals in a format appropriate for a default device or last device capable of performing the actions punch through which may be manually set or automatically set), etc.

When the remote control application is currently in a mode where it is displaying a configuration menu or when it is executing a setup wizard, the navigation key pad 104 may automatically revert to standard application functionality, i.e., menu up/down/left/right and select, for the duration of the setup wizard execution.

Control of Consumer Electronic Devices

The remote control application may be used to control the functionality of a large number of consumer electronic devices. While a TV will be used as a template device for the illustrative description that follows, it will however be appreciated that many other device types exist.

Figure 19A:
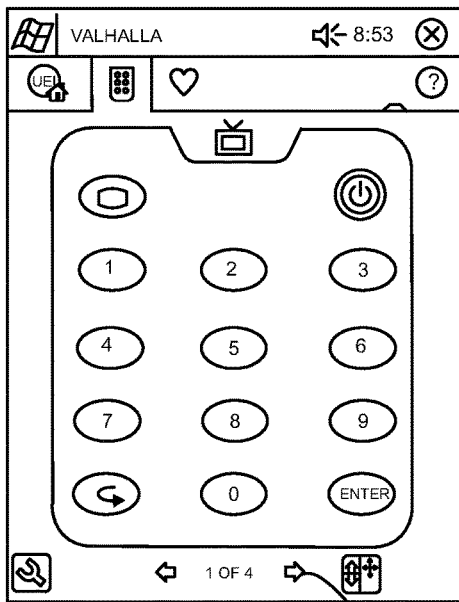
FIG. 19 illustrates exemplary remote control application device control pages.
Figure 19B:
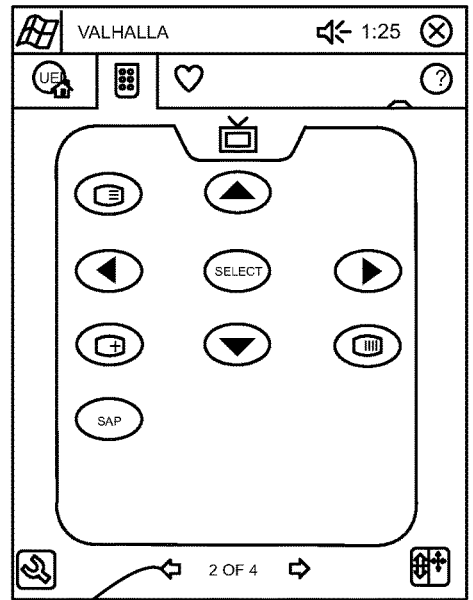
Figure 19C:
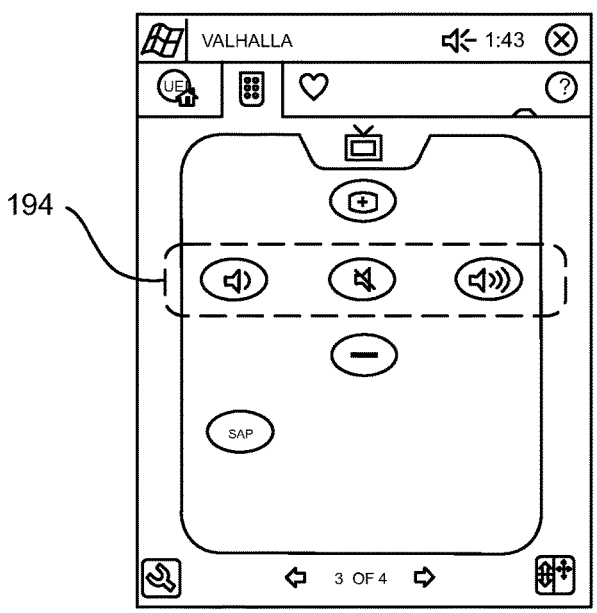

Operation of a TV device is as follows. Assuming that the TV has been setup as described earlier, the remote control application may be placed into a mode for controlling the TV, for example, by rotating the home page wheel 110 until the TV becomes the active (top) device icon—142 in FIG. 14i—and then either tapping the TV icon 142 or the controls tab icon 124, resulting in the display of the first page of device control page as illustrated in FIG. 19a. Depending on the device type, additional pages of control functions may be available as illustrated in FIGS. 19b and 19c. The user may navigate to these additional pages, if any, by using either the page hard key 102b or the control surface switching icons 192. When the user selects a device as described above, the control page displayed may be the last one used, as opposed to always beginning at page one. For example, if the last action a user previously performed before switching to another device type, such as the VCR, was to command volume adjustment then, on re-selection of the TV, the third page (FIG. 19c) might be displayed since this page contains the (most recently used) TV volume control buttons 194.

Figure 21A:
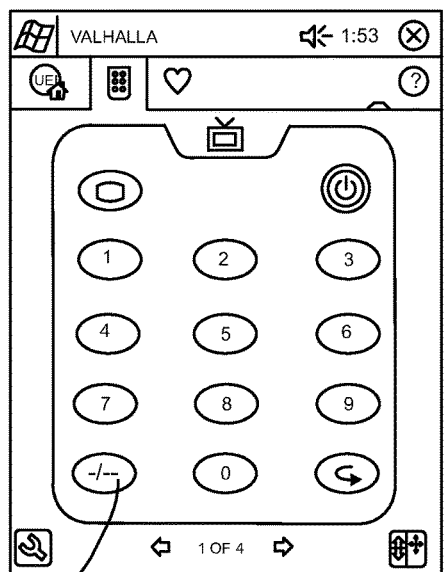
FIG. 21 illustrates an exemplary automatic customization of a remote control application device control page.
Figure 21B:
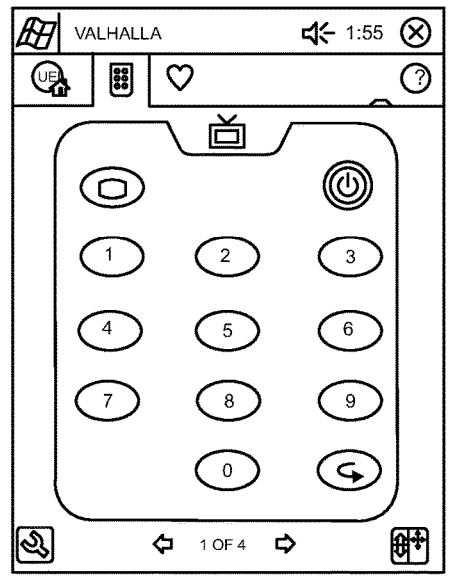

The soft keys displayed may be adjusted by the remote control application according to the specific device that has been setup. By way of example, FIGS. 21a and 21b show a control page as it may appear for two different television models. Of note, the Panasonic brand television model shown in FIG. 21b supports a "–/--" key 1212, while the Sony brand television model shown in FIG. 21b does not. In this example, the remote control application displays only those buttons for functions that actually exist on the device currently selected.

Figure 20A:
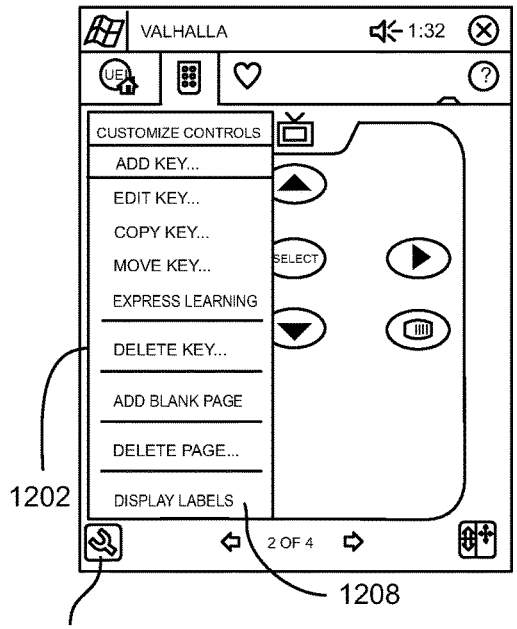
FIG. 20 illustrates an exemplary user customization of a remote control application device control page.
Figure 20B:
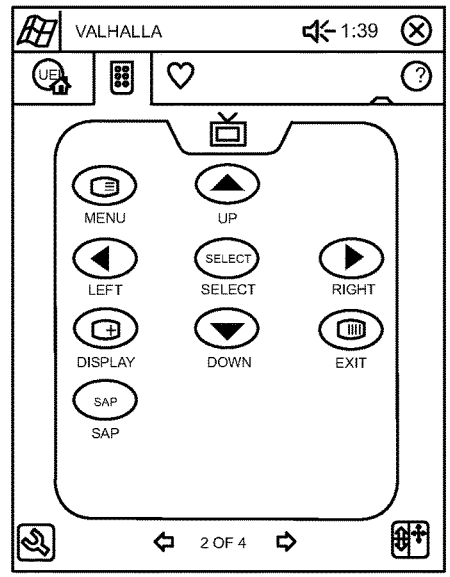

While a control page is active (i.e., displayed), the customize icon 122 may be used to invoke a menu 1202 which allows the user to make changes to key assignments and layout, learn new functions from another remote control or device, add and delete keys and pages, all of which will be discussed in further detail in sections to follow. Additionally, for convenience, from this menu 1202 the user may optionally enable a text display of key function labels as shown in FIG. 20b. By way of further explanation, the keys themselves are generally labeled using graphical icons wherever possible in order to eliminate language dependencies (as can be seen, for example, in FIGS. 20a and 20b), however, for users who are not familiar with the icon system, optional text labels may be provided.

Text labels may be generic functional names or may be the names assigned that function by the manufacturer of the device which is currently being controlled. By way of illustration, the remote control command function which returns a TV set (or other tuning device) to the channel that was previously being viewed is usually referred to generically as "last channel" or "previous channel." However, on Sony brand equipment this function is often labeled "Jump," on Panasonic brand equipment it is often labeled "R-Tune," etc. It will thus be appreciated that it may be advantageous in certain applications to offer the user key labeling in familiar terms.

As noted previously, the remote control application may display functions that support a standard level of functionality (i.e., those functions most commonly accessed), common power-related functions, or functions that are uncommon or extended functions that make device support 100% complete.

Control of Home Automation Devices

The remote control application is in general capable of controlling any device that can be controlled using IR or RF communications which includes home automation devices. In the case of home automation devices, the user may wish to have different button images to represent the functions and/or operation of these devices. Accordingly, additional button images may be made available to the user, either stored locally in the PDA 1150 or downloadable from, for example, a Web site or device, to help with the adoption and usage of the remote control application for controlling these devices. Such a list of optional button icons may include items such as on/off and open/closed icons for devices such as lights, curtains, blinds, air conditioning, heating, pool heater, spa, etc. The system may also have the ability to associate a function to an image, for example, to send a sequence of IR Codes to an X10 device.

Learning IR Codes

As new devices are introduced into the market, command sets to support such new devices can be added to the remote control application. This can be done one of three ways: learning, downloading, or occasionally refreshing the database that is burned onto the non-volatile memory of the PDA 1150. Detailed methods for learning IR codes are well known in the art (for example, see U.S. Pat. Nos. 4,626,848 and 6,097,309 which are incorporated herein by reference in their entirety) and the remote control application may be provided with the ability to learn IR codes from a new device-specific remote control using one or more of these or later-developed methods. To this end, the input signal to be learned may be provided to an IR receiver specifically provided for this purpose or may be derived from an output signal of an IR receiver 214 already built into the device 1150 as illustrated in FIG. 4.

Generally, IR codes are learned for a single function at a time. The user may choose to learn every available function or may elect to learn select functions for that device type. The user can also choose to replace the codes for existing functions with new IR code sequences. Additionally, the user can add a function that is not normally exposed for this device type. When new functions are added, the user may add a button that is to be assigned the learned command code(s) and provide the button with an appropriate label.

Generally, when the remote control application detects that learning mode has been entered, the software listens for new codes to learn. The software may respond audibly and/or visibly when codes are learned. Furthermore, the software may respond with a different audible tone and/or visible indication when codes are not able to be learned.

Assign and Playback Macros

Macros provide a way for the user to perform a combination of tasks quickly. There may be two types of macros supported by the remote control application—system generated macros and user generated macros. System generated macros are generated automatically or semi-automatically by the remote control application to facilitate common tasks like turning on and off the power to a home theatre system. System generated macros were described earlier.

User generated macros allow the user to manually program a sequence of actions to be assigned to a single button such that that sequence can be repeated by a press of the single button. An example of a user generated macro might be a "Watch DVD Movie" macro, which: 1) turns on the DVD Player; 2) turns the AMP to the DVD input; 3) turns on the TV; 4) sets TV input to "Video 1;" and 5) plays the Movie. Such a user defined macro may be initiated in an exemplary embodiment via an activity icon on the home screen device wheel 110.

Figure 22A:
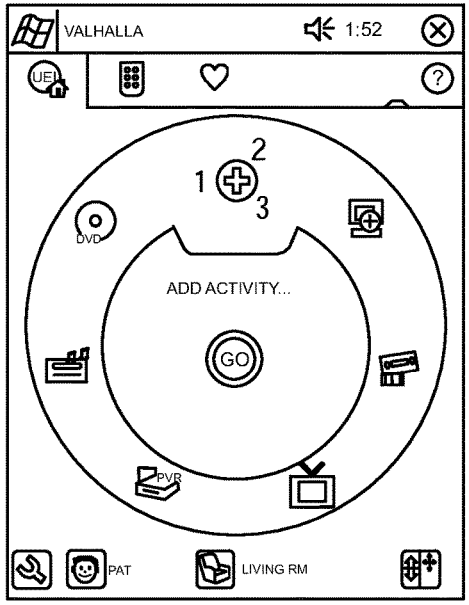
FIG. 22 illustrates an exemplary series of steps to program a remote control application activity or macro.
Figure 22B:
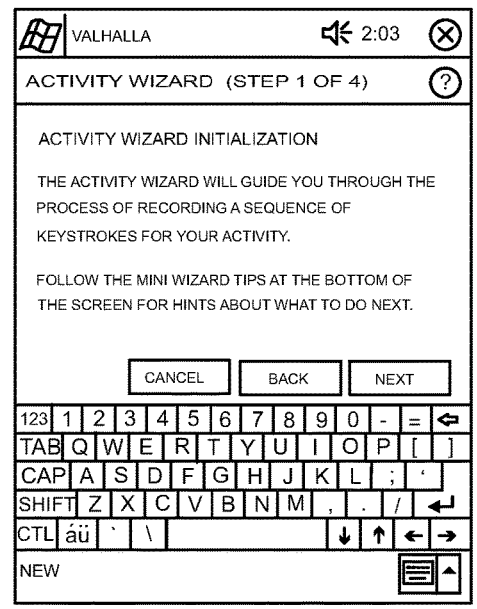
Figure 22C:
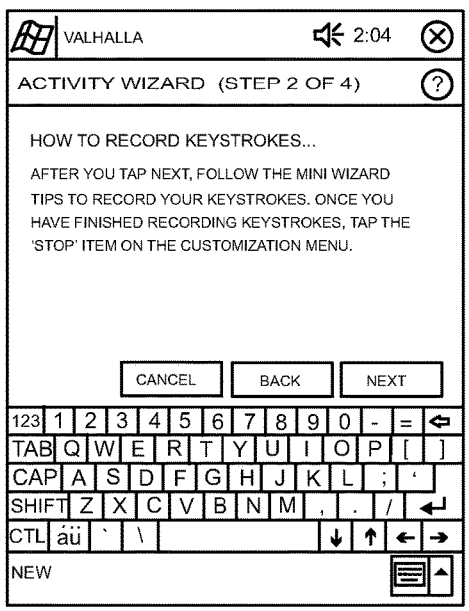
Figure 22D:
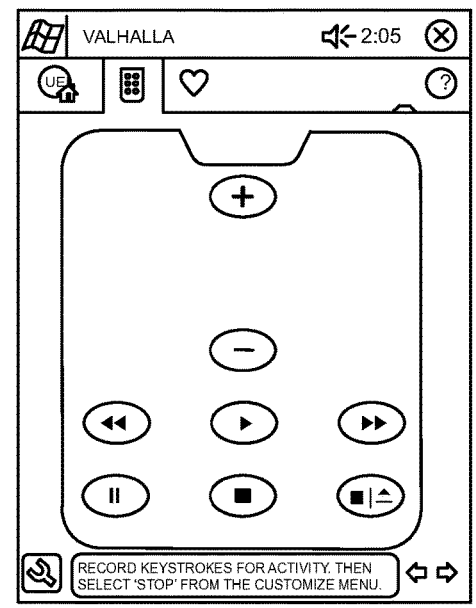
Figure 22E:
Figure 22F:
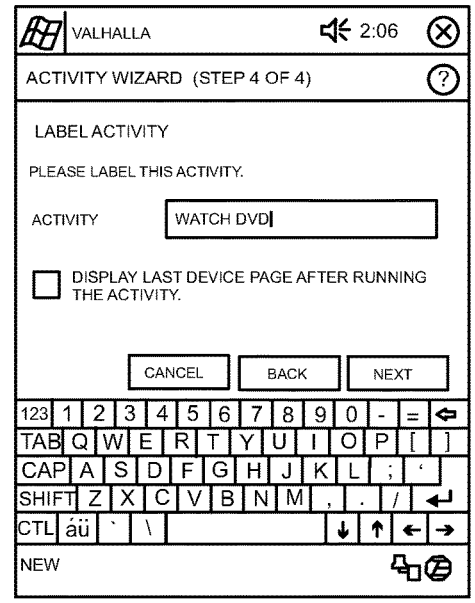
Figure 22G:

With reference to FIGS. 22a through 22g, the user may initiate programming of a new macro sequence by rotating the add activity icon 115 to the uppermost position of the wheel, for example by selecting it, as shown in FIG. 22a. Selection of the add activity icon 115 may then cause an activity setup wizard to be invoked that guides the user through the programming process. The activity setup wizard may begin by displaying some informative messages as shown in FIGS. 22b and 22c. The activity setup wizard may then prompt the user to enter a sequence of keystrokes to be stored as a macro. This entry process is similar to that previously described in conjunction with FIGS. 17e and 17f (definition of a favorites key) and, therefore, need not be repeated here. Upon completion of the sequence entry, the user may select an image (FIG. 22e) and name (FIG. 22f) to associate with this programmed activity. The user may also be provided with an option, for example via a checkbox 224, to have the macro playback, on completion, either remain at the home page (box unchecked) or switched to the device control page of the last device to be issued a command (box checked). This is useful where, for example, a user programming a "Watch DVD" macro may wish the sequence to end with the remote control switched to the DVD device control page (such as shown FIG. 22d) rather than the home screen page. When the macro definition is complete, the new activity ("Watch DVD" in this example) appears on the device wheel 110 as shown in FIG. 22g. Since similar images may be applicable to both devices and activities, activity icons may be displayed in a different color than device icons. In addition, the control button 117 in the center of the wheel may be changed to a green "GO" button in place of a red "Power" button.

It is to be appreciated, that the software may allow a macro to be assigned to any screen that controls devices. Furthermore, the software may allow macros to be added as punch-through commands for the hardware hotkeys as well as common user interface elements. Still further, the software may allow macros to be copied, linked, and/or edited. For use in editing, the software may allow a step-through capability to ensure that the macro functions as desired and provide a macro editor so that the user can fine-tune the macro. Macros can also be recorded with non-timed key strokes and/or with timed key strokes.

Customization and Reassignment of Keys

The remote control application may allow the user to expose functionality from one device on a control page that represents another device or simply rearrange the button layout of a given device control page. Customization and key reassignment may be accomplished by use of the copy key and move key functions accessible from the customization menu 1202 shown by way of example in FIG. 20a. Using the customization menu 1202, the user may choose to override an existing button or add a new button to the screen. For example, copying a key function creates a link to the underlying functionality so, if the underlying behavior of the linked to key is modified, all linked keys would be updated. Alternatively, the user may have the option to change the default state (a link) to become a copy of the original functionality. In this instance, modifying the functionality of the "original" key would not affect the other keys which were assigned the functionality of the "original" key.

In addition to redefining underlying key functionality as described above, the user may also be offered the option of adding new keys or editing existing keys. In this manner, key shapes and labels may be changed as needed. The remote control application may offer a selection of locally-stored key shapes and colors to choose from, others may be downloaded from the desktop 1104 or Web hosted services 1106. By way of example, each button image may comprise two states, "Up" and "Down," to enable a user to differentiate between an incative button and a pressed or activated button. The remote control application may also support customization features such as are described in U.S. Pat. Nos. 5,959,751, 5,515,052, and 6,014,092 which are incorporated herein by reference in their entirety.

Manage Favorites

Since each user may have different viewing habits and favorite channels, the remote control application may allow the favorites to be global (for all users) or specific to a user. For example, in a household with several people the channel lineup will remain the same, however the favorites for an individual may vary. Furthermore, since favorites may actually perform several functions (associating a readily identifiable logo with a network channel and/or sending IR or other commands to direct a device to the proper channel), it may be of use for one individual to set up the entire network lineup as favorites, and allow other users to copy the entire set of favorites pages. Each user may then further customize their set of favorites pages by eliminating those that are not normally viewed, or re-arranging the favorites onto pages to their liking. This technique of eliminating favorites may also be used, for example, by a parent when configuring an acceptable channel lineup for a child. The child's user profile could be set up with a PIN that the child doesn't know (and thus has no ability to configure) and/or set up as a Guest so that other configuration changes may not be made. There may also be a setting in the interface to only allow (on a per-user basis) channel access through favorites (and not by channel up/down or numeric keypad entry) to further limit the channel lineup associated to particular individuals.

Assistance may be offered during the setup of favorites described earlier in conjunction with FIG. 17. For example, a short list (seven entries, for example) may be maintained by the remote control application which represents a user's most frequently accessed channels. During execution of the favorites setup wizard, the current list of frequently accessed channels may appear thereby allowing rapid, semi-automatic programming of favorites buttons effected by picking channels from the displayed list. Optionally, the user may be able to create multiple such lists to cover a variety of genres or categories built into the favorites setup wizard.

When the remote control application is adapted to be used in connection with EPG functionality, the system may read extended channel information provided in the EPG to automatically group the channel into categories. Genre categories may also be supported, for example Personal, News, Sports, Movies, Music, etc. The user may be able to create additional categories with custom names. The user may be able to add a channel number (with device) to a category. The user may be to add a label to the channel. The user may be able to associate a logo with the channel. The system may handle favorite channels implemented across multiple input sources. For example, the movies list may contain one local cable channel and four channels supported by satellite. The remote control application may also monitor the EPG data periodically downloaded from the hosted services site 1106 for changes in a channel line-up to thereby adjust favorites channel programming sequences either automatically or by user option.

The favorites page display may also be adaptive. In this regard, the remote control application, on an user by user basis, may organize the display of the favorites page as a function of frequency of channel access. The most off selected channels may be displayed on the top of the list. This display order may also change based on day of week and time of day, either automatically or by user request.

Extensible File Format

User IR Code DB

The user IR code database may be used to store supplemental IR Codes as they are downloaded from the website or from some other sources. This is separate from the standard IR code database shipped with the PDA 1150. The user IR database may or may not contain learned codes. It is desired that all learned codes are accessible to all users of the remote control application.

Device Configuration File

The device configuration file contains the devices the user has configured to control with the remote control application. The device configuration file may also describe the contents and layout of the device control pages of the remote control application for each device. The device configuration file may additionally contain any resources required by the individual device. The list of resources include, but are not limited to, macros, IR codes, bitmaps, string literals and other required data.

Extensibility of Configuration Files

In order to manage the configuration and user set-up data associated with the remote control application as described in the preceding sections, it is advantageous to store this information in a file system which is designed to facilitate easy future extensions to the information stored as well as transfer of this information between like devices. An exemplary file structure which may be used to achieve these goals is presented in the following paragraphs and Tables 1 through 12 below.

Configuration Header

As illustrated in exemplary Table 1, the configuration header contains data fields for use in describing attributes of the file.

TABLE 1

| Attribute | Description | Type | Size |
|---|---|---|---|
| RecordSize | Size of this record | USHORT | |
| PageWidth | Width of a page | Short | |
| PageHeight | Height of a page | Short | |
| FileVersion | Version of this file format | BYTE | 8 |
| PlatformID_Key | ID to a record in the Platform Table | Long | |
| ArchiveFlag | Specifies when the document is to be archived. | Long | |

Platform & Hardware Table

As illustrated in exemplary Table 2, the platform & hardware table contains data fields for use in describing attributes of the hardware platform on which the file was generated.

TABLE 2

| Attribute | Description | Type | Size |
|---|---|---|---|
| RecordSize | Size of this record | USHORT | |
| PlatformID_Key | Unique ID for this device | Long | |
| ScreenWidth | Screen Width | Short | |
| ScreenHeight | Screen Height | Short | |
| HardwareKeyMap_ID | Hardware Key Map | UINT | |
| PADSize | Size of Paddings | Short | |
| PAD | Padding . . . | BYTE | variable |

Device Table

As illustrated in exemplary Table 3, the device table contains data fields for use in describing the attributes of each of the devices the user has setup the remote control application to control.

TABLE 3

| Attribute | Description | Type | Size |
|---|---|---|---|
| RecordSize | Size of this record | USHORT | |
| DeviceID_Key | Unique ID for this device | Long | |
| LabelLength | Length of the string label | Short | |
| Label | String literal for this device | Char | variable |
| DeviceType | Class of device this device header refers to | UINT | |
| SetupCode | Code for this particular Device | UINT | |
| BrandNameLength | Length of the BrandName string | Short | |
| BrandName | String literal of this brand | Char | variable |

TABLE 3-continued

| Attribute | Description | Type | Size |
|---|---|---|---|
| ModelLength | Length of Model string | Short | |
| Model | String literal of this Model | Char | variable |
| DeviceSpecificDataSize | Size of the DeviceSpecificData | Short | |
| DeviceSpecificDataConfig | DeviceSpecificData | BYTE | variable |
| DownloadDeviceDataSize | Size of the downloaded data | Short | |
| DownloadDeviceData | Downloaded data | BYTE | variable |
| OriginFlag | Who created this record | UINT | |
| PADSize | Size of Paddings | Short | |
| PAD | Padding . . . | BYTE | variable |

External downloaded data will be stored in DownloadDeviceData.

Page Table

As illustrated in exemplary Table 4, the page table contains data fields for use in describing the attributes of each display page of the remote control application.

TABLE 4

| Attribute | Description | Type | Size |
|---|---|---|---|
| RecordSize | Size of this record | USHORT | |
| PageID_Key | Unique ID for this page | Long | |
| DeviceID_Key | Parent Device ID | Long | |
| BackgroundID_Key | ID to a resource record | Long | |
| PageType | Describes what this page will contain - Home Page, Power, Home Theatre, Device Page, Favorite Page | UINT | |
| BackgroundFillRGB | RGB Fill Color | COLORREF | |
| OriginFlag | Who created this record | UINT | |
| PADSize | Size of Paddings | Short | |
| PAD | Padding . . . | BYTE | variable |

Page records are preferably grouped by device ID.

COLORREF is preferably a 32-bit value used to specify an RGB color.

Label Page Table

As illustrated in exemplary Table 5, the label page table contains data fields for use in describing the labels within a page.

TABLE 5

| Attribute | Description | Type | Size |
|---|---|---|---|
| RecordSize | Size of this record | USHORT | |
| LabelID_Key | Unique ID for this Label | Long | |
| PageID_Key | Parent Page ID | Long | |
| LabelLength | Length of label string | Short | |
| Label | String Literal | Char | variable |
| LocationX | X Location | UINT | |
| LocationY | Y Location | UINT | |
| LocationZ | Z Location | UINT | |
| Width | Width of Label | UINT | |
| Height | Height of Label | UINT | |
| Font | Font Type | UINT | |
| FontSize | Font Size | UCHAR | |
| FontAlignment | Font Alignment (Center/Left/Right) | UCHAR | |
| TextColor | RGB Color of the Text | COLORREF | |

Border Table

As illustrated in exemplary Table 6, the border table contains data fields for use in describing page borders.

TABLE 6

| Attribute | Description | Type | Size |
| --- | --- | --- | --- |
| RecordSize | Size of this record | USHORT | |
| BorderID_Key | ID to a resource record | Long | |
| PageID_Key | Parent Page ID | Long | |
| LocationX | X Location | UINT | |
| LocationY | Y Location | UINT | |
| LocationZ | Z Location | UINT | |
| BorderFillRGB | RGB Color of the Fill | COLORREF | |

Key Table

As illustrated in exemplary Table 7, the key table contains data fields for use in describing attributes of keys supported by the remote control application.

TABLE 7

| Attribute | Description | Type | Size |
| --- | --- | --- | --- |
| RecordSize | Size of this record | USHORT | |
| KeyID_Key | Unique ID for this Key | Long | |
| PageID_Key | Parent Page ID | Long | |
| LabelLength | Length of key label string | Short | |
| Label | String Literal | Char | variable |
| LocationX | X Location | UINT | |
| LocationY | Y Location | UINT | |
| LocationZ | Z Location | UINT | |
| ImageUpID_Key | ID to a resource record | Long | |
| ImageDownID_Key | ID to a resource record | Long | |
| ImageDisabledID_Key | ID to a resource record | Long | |
| SoundDownID_Key | ID to a resource record | Long | |
| SoundUPID_Key | ID to a resource record | Long | |
| Status | Status of key | UINT | |
| FunctionID_Key | ID to a Function record | Long | |
| MacroID_Key | ID to a set of macro records | Long | |
| FontType | Font Type | UINT | |
| FontSize | Font Size | UCHAR | |
| FontColor | Font Color | COLORREF | |
| FontAlignment | Font Alignment | UCHAR | |
| KeyType | Moveable Y/N | BOOL | |
| KeyPlacement | Hardkey/Softkey Y/N | BOOL | |
| ValidityDay | Days the key is valid | Long | |
| ValidityTime | Time the key is valid | Long | |
| OriginFlag | Who created this record (User, Dynamic, . . . ) | UINT | |
| PADSize | Size of Paddings | Short | |
| PAD | Padding . . . | BYTE | variable |

Key records are grouped and sorted by PageID_Key.
KeyType is a boolean to specify the key is movable or not.

Function Table

As illustrated in exemplary Table 8, the function table contains data fields for describing functions performed in response to activation of a key.

TABLE 8

| Attribute | Description | Type | Size |
| --- | --- | --- | --- |
| RecordSize | Size of this record | USHORT | |
| FunctionID_Key | Unique ID for this page | Long | |
| FunctionNameLength | Length of FunctionName string | Short | |
| FunctionName | String Literal of the function Name | Char | variable |
| HardwareType | Hardware Type that implements this function | UINT | |
| DeviceType | Class of device this device header refers to. | UINT | |
| DeviceID | UEI ID for this Device | UINT | |
| DeviceID_Key | ID to Device | Long | |

TABLE 8-continued

| Attribute | Description | Type | Size |
| --- | --- | --- | --- |
| LearnedKeySize | Size of learned data | Short | |
| LearnedKey | Block of learned Key Data | BYTE | variable |
| MagicCode | UEI Magic Code | UINT | |
| KeyCode | ID to a resource record | Long | |
| HardwarePayloadSize | Size of HardwarePayload data | Short | |
| HardwarePayload | Hardware specific data stream | BYTE | variable |
| MacroID_Key | ID to a set of macro records | Long | |
| PageID_Key | Page to be jumped to | Long | |
| OriginFlag | Who created this record | UINT | |
| PADSize | Size of Paddings | Short | |
| PAD | Padding . . . | BYTE | variable |

HardwareType may be, for example, RF or IR transmitter IC.

If the ID function is in the downloaded data, then DeviceID_Key is pointing to the device; otherwise, it's NULL.

Macro Table

As illustrated in exemplary Table 9, the macro table contains data fields for describing attributes of a macro function.

TABLE 9

| Attribute | Description | Type | Size |
| --- | --- | --- | --- |
| RecordSize | Size of this record | USHORT | |
| MacroID_Key | ID for this macro set | Long | |
| FunctionID_Key | ID to a function record to execute | Long | |
| NextMacroID_Key | ID to a Next Macro Record to execute | Long | |
| KeyDownTime | The amount of time is milliseconds the key stays down | UINT | |
| InterKeyDelay | Delay amount after execution in milliseconds | UINT | |
| OriginFlag | Who created this record | UINT | |
| PADSize | Size of Paddings | Short | |
| PAD | Padding . . . | BYTE | variable |

Any nested macros will be copy entire functions from the macro list to the new macro list.

Resource Table

As illustrated in exemplary table 10, the resource table contains data fields for defining resources (e.g., image file, sound file, etc.)

TABLE 10

| Attribute | Description | Type | Size |
| --- | --- | --- | --- |
| RecordSize | Size of this record | USHORT | |
| ResourceID_Key | Unique ID of a resource | Long | |
| ResourceType | Type of resource stored (Bitmap, Wave, . . . etc) | UINT | |
| ResourceDataSize | Size of the resource data | Long | |
| ResourceData | Byte stream of the resource | BYTE | variable |
| ResourceWidth | Width | UINT | |
| ResourceHeight | Height | UINT | |
| PADSize | Size of Paddings | Short | |
| PAD | Padding . . . | BYTE | variable |

Event Journal File

As illustrated in exemplary Table 11, the event journal table contains data fields for describing events captured during the course of operation of the remote control application.

TABLE 11

| Attribute | Description | Type | Size |
|---|---|---|---|
| RecordSize | Size of this record | USHORT | |
| EventID_Key | Unique ID of this Event | Long | |
| EventType | Type of Event, System or User | Long | |
| EventTime | Time of the event | Date/time | |
| EventDataSize | Size of EventData | Short | |
| EventData | Data of the event | BYTE | variable |
| PADSize | Size of Paddings | Short | |
| PAD | Padding . . . | BYTE | variable |

User Profile File

As illustrated in exemplary Table 12, the user profile file contains data fields for use in describing user attributes.

TABLE 12

| Attribute | Description | Type | Size |
|---|---|---|---|
| RecordSize | Size of this record | USHORT | |
| UserProfileID_Key | Unique ID of this User Profile | Long | |
| UserNameLength | Length of UserName | Short | |
| UserName | Name of the User | Char | variable |
| UserAvatarID_Key | ID to a resource ID | Long | |
| UserPin | 4 digit PIN. (Or minimum password length as recommended/required by the operating system software.) | UINT | 4 |
| UserTimeOut | Time before the user is logged out | | |
| UserRole | Role of the User | | |
| UserRating | V-Chip Rating for the User | | |
| PADSize | Size of Paddings | Short | |
| PAD | Padding . . . | BYTE | variable |

Room Profile File

As illustrated in exemplary Table 13, the room profile file contains data fields for use in describing room attributes.

TABLE 13

| Attribute | Description | Type | Size |
|---|---|---|---|
| RecordSize | Size of this record | USHORT | |
| RoomID_Key | Unique ID of this Room Profile | Long | |
| RoomNameLength | Length of RoomName | Short | |
| RoomName | Name of the Room | Char | variable |
| Locale | Location of Room | UINT | |
| PADSize | Size of Paddings | Short | |
| PAD | Padding . . . | BYTE | variable |

Functionally, it is to be appreciated that file formats may be versionable, file formats may be backwards compatible, file formats may be extensible to include new features, file formats may allow third party developers to use the storage mechanism, file formats may provide an efficient storage model, and files may reduce duplication of expensive resources like bitmaps.

Configuration Files to Support Multiple User Profiles

The remote control application is preferably designed to be used by multiple users. Accordingly, a user profile file may store data about a user of the system including the user name, bitmap for the user avatar, user PIN or password and all preference settings. In addition, the short list of most frequently accessed channels on a per-user basis may be stored in the user profile. The user's favorite channel list (and associated network logos) may be stored in the user profile as well.

In certain instances, it may be preferred to designate a primary user that controls the look and functionality of the remote control application. All the other user profiles may be derived from the primary user's user profile (the "master profile"). Any changes in the master profile may be updated in any of the profiles that are based from the master profile. Thus, the master profile may be fashioned after a template where any documents using the template may be updated if the template is modified.

Once the primary user has setup the main configuration, new configurations can be created based on the master profile. The primary user may choose which devices and which levels of functionality to expose. This can include backgrounds, specific favorites and other features. The primary user may also choose whether the profile is to be "locked down," which may be used to prevent any additional customization by other users of the profile. In this manner, the primary user can maintain complete control over the way other users (e.g., family members) interact with the remote control application.

All adaptive learning functions may be stored within each profile so that the individual users can access their favorite channels rather than anyone else's. Even if a profile is "locked down," favorites may be stored on a per-user basis. Additional facilities may be needed to give the primary user the ability to review the viewing habits of other family members.

For personalization, icons (or avatars) may represent each user. The avatar may be a 32×32 bitmap stored in the user profile. When the remote control applications starts, a splash screen may be generated with the bitmaps to allow the current user to select an appropriate user avatar and, thereby, gain access the remote control application configuration associated with the selected user.

User Profile

The following Table 14 contains exemplary attributes of the user profile object type.

TABLE 14

| Attribute | Description |
|---|---|
| User Profile ID | Primary Key - Unique ID of this User Profile |
| User Name | Name of the User |
| User Avatar File Path | File location to the Avatar |
| User Avatar Bitmap Data | Avatar bitmap data |
| User Avatar Bitmap Data Size | Size of the Avatar bitmap data |
| User Avatar Width | Width of the Avatar Bitmap |
| User Avatar Height | Height of the Avatar Bitmap |
| User Nickname | Nickname for the user |
| User Pin | 4 digit PIN |

Favorite Map

The following tables contain exemplary attributes of the favorite map object type.

TABLE 15

| Attribute | Description |
|---|---|
| Favorite ID | Primary Key - ID to this Favorite |
| Device ID | Foreign Key - ID to the Device which supports this channel favorite - Satellite, Cable Box, Tivo or VCR. |
| Channel # | The channel # for the favorite |
| Channel Name | The channel name of the favorite |
| Network 4 Letter identifier | The channel 4 letter identifier. |
| Network Logo Bitmap ID | Foreign Key - ID to the Bitmap table stored in the configuration file |
| User Network Logo File Path | File location to the Network Logo |

TABLE 15-continued

| Attribute | Description |
|---|---|
| User Network Logo Bitmap Data | Network Logo bitmap data |
| User Network Logo Bitmap Data Size | Size of the Network Logo bitmap data |
| User Network Logo Width | Width of the Network Logo Bitmap |
| User Network Logo Height | Height of the Network Logo Bitmap |

Thus, the remote control application may store information regarding a user's preferences in a configuration file. The user profile may store the user name, bitmap for the user avatar, user PIN and all preference settings, including favorites, network logos and the results of adaptive learning. Since the system may support multiple configuration files per user, the system may display content using (by default) the user's last used configuration file. The system may also allow the user to select a different configuration file to use. The system may allow multiple users to store their configuration files on the same PDA 1150. The system may store the identity of last user that used remote control application. The system may require that one of the users be named as a primary user. The configurations set in the master profile for the primary user may be available for use in establishing configurations used by other users. Any changes made to the master profile may be available to the configurations used by other users. The system may allow the primary user to determine the level of "lock down" associated with one or more user configurations which may, in turn, determine how secondary users can customize their settings.

Restore Point

Whenever the user performs an operation that may change the configuration of the remote control application, the remote control application may create a restore point just before making the change to the configuration. For example, the system may create a restore point when the user changes the configuration file, changes user settings, or changes the IR code database. Thus, the restore point maintains settings the remote control application may revert to if the user decides to return to a state prior to a change.

The restore point may be reset if the user chooses to save the new configuration and update the restore point, for example, by interacting with a check box in a save dialog. Preferably, the supplemental IR database is backed up using a restore point when the remote control application learns new IR codes. The supplemental IR database is also preferably backed up when the user applies a new IR database patch. Generally, the configuration file may be backed up on local storage. However, if no local storage is available, the configuration file can be uploaded to a PC the next time the device 1150 is docked. To this end, the user may be prompted to dock the device after making changes and the user may be continually prompted to dock upon startup of the remote control application until it is detected that the configuration file has been successfully backed up. When docked, the configuration file may be automatically backed up if anything has changed. A CRC may be stored in the file after changes. If the CRC changes between synchs, the file may be backed up (given that space is available).

Guest Mode

The primary user may elect to allow guest access (created as another user profile) which allows the guest user to operate the home system in a simple way, e.g., no learning functions are available, there is no access to other programs on the device 1150 without PIN confirmation, etc. Furthermore, guest access may override the ability to power down and reboot the system as a means to circumvent the guest mode. The guest profile may be based on the master profile as a base configuration and the guest may have no ability to change the configuration.

Security

For a user, the most sensitive information in remote control application (without support for E-Commerce transactions) is generally considered to be the data stored in the event journal. For the manufacturer, the most sensitive information is generally considered to be the IR code database. Therefore file encryption may be applied to the event journal and the IR code database as a measure of security.

The user may have other sensitive data stored on the PDA 1150, including, but not limited to: schedules, contacts, financial information, notes, and email. The user needs to feel confident that the device 1150 used to hold this confidential information can sit on or near the coffee table for hours in the evening, with others around. This level of confidence may be provided by limiting access to only the remote control application functions when the remote control application is executing unless a PIN code is entered. Furthermore, the primary user may elect that no additional named users are allowed and that guest access is denied. The primary user may enter a PIN for secure transactions, including starting the remote control application. This puts the remote control application in a mode that no other programs can be accessed without a PIN code to thereby render all external data safe.

If the primary user elects to add secondary named users, they may also have PIN codes assigned. Secondary named users may be able to learn functions (if the primary user has not "locked down" the configuration) and store favorites. However, there may be no access by secondary users to other applications or files on the PDA 1150 without PIN confirmation.

Quick Assignment of Channel Number to Network Logo

Since the cable and satellite companies are constantly refining their channel line ups, the remote control application should provide a simple way to modify the channel numbers that the user assigned to favorites. Such channel number reassignment may be accomplished by, for example, the user holding down a channel logo (i.e., a button used to tune to a channel) for a given time (e.g., 3 seconds—as opposed to tapping it, which would normally execute the channel selection or other sequence assigned to the key) to invoke a setup wizard similar to that previously described in connection with FIGS. 17*a* through 17*h*.

Alternatively, the user may specify a channel number as a numeric variable instead of a series of keystrokes. This number is then converted by the remote control application into an appropriate sequence of IR command signals at time of execution. For additional background regarding methods for specifying and converting numeric variables into remote control IR signals, the reader is directed to co-pending application No. US2003/0117427 entitled "System and Method for Interacting with a Program Guide Displayed on a Portable Electronic Device" of like assignee, which is incorporated herein by reference in its entirety.

Besides simplifying user definition of favorites, in the case of a remote control application that supports EPG functionality this approach can also keep the favorite channels (and perhaps others) in synch by monitoring the channel listings from the EPG. In this case, when an EPG is downloaded, typically on a periodic basis, the remote control application may compare the most recently downloaded EPG against a previously downloaded EPG to determine if any channel assignments have changed. If any channel assignments have changed, the remote control application may then check the favorites list to determine if any of the changed channels are listed therein. If so, the remote control application may update the favorites channel list to reflect the new channel number assigned to a favorite. By way of example, assume that an EPG comparison indicates that "ESPN" has changed from channel 29 to channel 45. If "ESPN" is in the favorites list, the favorites list will be updated to change the mapping of "ESPN" from channel 29 to channel 45 whereby subsequent activation by the user of the "ESPN" logo icon will cause the transmission of command(s) to tune the target device to the correct channel assignment.

It is also contemplated that the remote control application may store favorite channel assignments as broadcast channel identifiers and use the data in the EPG to dynamically convert these channel identifiers to absolute channel numbers each time the favorite is selected by the user. In this case, in keeping with the previous example, a favorite would be stored simply as "ESPN" which would be translated to channel 29 or channel 45, as appropriate, based on the EPG data currently loaded at the time the "ESPN" logo icon is activated (i.e., the channel the current EPG shows "ESPN" is being broadcast on). In this manner, there would be a late binding between the "ESPN" favorite and the channel on which "ESPN" is being broadcast.

When logo icons or other icons are activated, different states may be displayed to the user. For example, the system may support a network logo in the form of two bitmaps corresponding to a button up state and a button down state. Logo dimensions and color depth to be used may be supplier specified and may vary for the different platforms. The system may also store network logos in the user profile, since the favorite channel information may be there.

Download Skins

Skins are manufacturer or user developed bitmaps to represent buttons, backgrounds, etc. A button can have multiple states, up, down and disabled. The disabled state may be used to support functionality where two-way communication between the target device and the remote control is possible, where a particular user profile has no access to a function (for example, because it has been disabled by the primary user), etc.

Configuration files containing bitmap resources may be made available as part of vendor-supplied extended features offered on Web-hosted extended features service 1146 or may be uploaded by users themselves to a Web hosted user community 1142 for downloaded by other users. Such configuration files may be made available for specific devices or may represent generic keyshapes, etc., suitable for use with any device. By way of example, the system may look in a default named local directory for configuration files and in a default named directory on the host PC for configuration files to be updated during ActiveSync. When updated, the system may override bitmaps from previous configuration file.

Copy Configuration from One PDA to Another

The ability to share configuration files allows for growth in usage of the remote control application. A configuration file can be shared in a number of ways. It could be uploaded to an Internet site, sent via mail, or copied on to a floppy disk. The user who receives a configuration file may use the ActiveSync application to load it onto a PDA 1150. Another method is that a user could transmit (referred to as "beaming") the configuration via the IRDA port on one PDA to another PDA. This method takes advantage of facilities available on the typical PDA hardware platforms.

The configuration file can be broken down into elements, for example devices, pages, themes, learned IR codes, network logo icons and favorites. The user may wish to share only a few elements or the whole configuration file.

The configuration files are preferred to have versioning, so that if a user shares a configuration file with a user who has an older version of the remote control application, the transferred configuration file is handled gracefully. If the configuration file has a dependency on a new version of an IR database module, then the user may be notified that the device may not function properly until the user updates their IR database. The system may be able to check version number of the software, version number of the IR Transmitter IC installed, and/or determine the form factor (PDA or WebPad) and the OEM of the platform.

The sending user may select from a list of options what they want to beam. The receiver may choose whether the received configuration file is merged with an existing configuration file or stored as a new configuration file. If the configuration file is merged, the remote control application may ask the user if the would like to update their home theatre mode settings. The receiving system may determine the destination location for the beamed or downloaded resources. Furthermore, users may be able to copy resources related to a configuration file to a hosted Website to enable sharing on a global basis. Thus, unlike most current home universal remote controls that only support a single configuration, the system may provide a mechanism to allow users to have multiple configurations to choose from.

Download Network Logos

A network logo is a graphical representation of a network station or channel. In its base form, it is a button with an up bitmap and a down bitmap. A disabled bitmap is not needed since the button does not have any state. The download network logos feature represents a set of resources that can be accessed through the Internet. To implement this feature, almost all of the architecture modules come into play: hosted remote control software services, desktop remote control software applications, and remote control software. Network logo sharing may allow users to transmit the network logo information button to another user, where the receiving user could chose to add it to the favorite list, channel lineup page, or the like. The system may operate in connection with a mechanism to establish access to network logo bitmaps from technology partners such as cable operators or EPG providers. Network logos may also be made available from a hosted Web site. The system may allow users to share network logos through IR beaming.

Journal Activity

The event journal may contain a list of user and system actions that have occurred within the remote control application. The event journal may also contain broadcast messages from devices within the home. The event journal is a log of what the user has done as well as what is happening within the home. The user may be able to switch between a verbose mode and an alert mode for the broadcast messages. The event journal may also be used for debugging purposes.

An exemplary event journal entry format is shown in Table 16.

TABLE 16

| Attribute | Description |
| --- | --- |
| Event ID | Primary Key - Unique ID of this Event |
| Event Type | Type of Event, System or User |
| Event Title | Title of Event |

TABLE 16-continued

| Attribute | Description |
| --- | --- |
| Event Data | Data for the Event |
| Event Time | Time of the Event |
| Event User ID | Foreign Key - To the user who generated the event |

The Event Journal may be uploaded to a PC with an ActiveSync application.

Application Programmer Interface (API) for Third Party Developers

Some users may be developers who wish to develop extensions to the remote control application. Thus, the remote control application may expose functionality to third party developers to build extensions. The support provided may be via custom configuration files that contain third party graphics and supplemental IR codes.

Exceptions

The remote control application running on a platform should exhibit graceful behavior under exception condition. Some examples of such conditions and appropriate responses for the remote control application are as follows:

Low power situation: A low power indication is generated by the underlying PDA operating hardware while the remote control application has focus. In this case the remote control application may issue an indication to the user and also take steps to minimize power consumption by, for example, disallowing certain actions. Since the remote control application should not lose any of setup and configuration information when the PDA 1150 runs out of power, the remote control application may store this type of data in non-volatile memory (if available) and may inhibit any write activity (i.e., changes to that memory) during low power situations.

Low memory or low storage indication received: If the operating system of the platform issues a low memory or low storage indication while the remote control application has focus, the remote control application may issue an indication to the user, relinquish to the system any scratch memory it has in use, inhibit setup or other activities which may consume additional storage, suspend journaling activity, and take any other steps possible to minimize memory and storage requirements.

Installation of new (updated or extended) version of remote control application: If the user installs a new version of the remote control application this may detect that initial installation has already been configured for a previous version of the application and may use those configuration settings as the default settings during any new installation/customization process that occurs.

Additionally, the remote control application may behave gracefully if the user temporarily changes the allocation of storage and program memory while the remote control application is active. Installation of a supplemental version of the remote control application may gracefully use all of the configuration settings that currently exist.

Desktop Remote Control Software Applications

The desktop remote control applications 1104 are applications that are installed on the user's PC 1152 to support the remote control application on the PDA 1150. Examples of PC remote control software applications include:

Configuration Designer

The configuration designer 1134 may allow a user to create a configuration file on the PC that can be loaded into remote control application.

Configuration Emulator

The configuration emulator 1136 may allow the user to review the configurations on the PC as if it were running on the target PDA.

Restore/Backup Configurations

This component 1130 may allow the user to backup and restore configuration files and event journals over the ActiveSync communications conduit to/from the PC and the PDA 1150.

Update Checking/Supplemental Patch Download

This component 1132 may review current version numbers of remote control application and IR code databases, verify them against a Web hosted update service, and inform the user whenever later versions are available for download. Optionally, this component may also perform the updates automatically via the ActiveSync conduit.

Cultural and Political Requirements

The remote control application may be shipped with a world-wide IR code database and may be used in many international locations. The remote control application may thus support localization, for both language as well as key layout variations to support regional settings. With reference to FIGS. 23*a* through 23*d*, the room setup wizard input requirement at step 2 may be expanded from that shown in FIG. 16*c* to include a drop-down list 230 from which various regions may be selected. Based on this input, the behavior of the remote control application may be adjusted to more closely match the region in which it is being used. For example, the order in which IR device codes are presented to the user for testing in the drop-down menu 1430 (FIG. 14*f*) during device setup may be varied from region to region in order to place the most likely (i.e., most popular in that country or region) codes at the top of the list. Furthermore, even within the same IR code set, functionality and key assignments may also vary by region and may be automatically adjusted based upon the region selected.

Figure 23A:
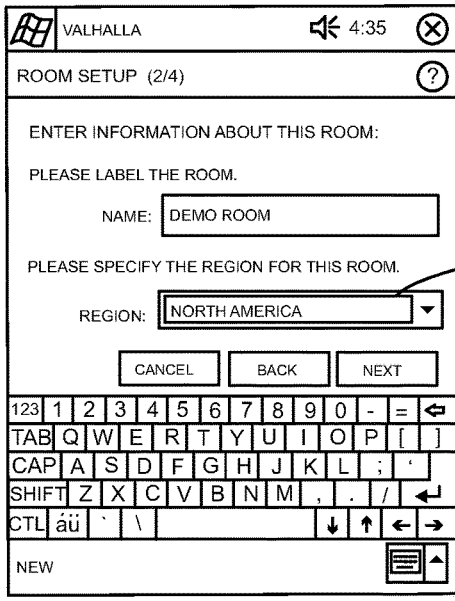
FIG. 23 illustrates an exemplary automatic adjustment of a remote control application device control page based on a geographical region.
Figure 23B:
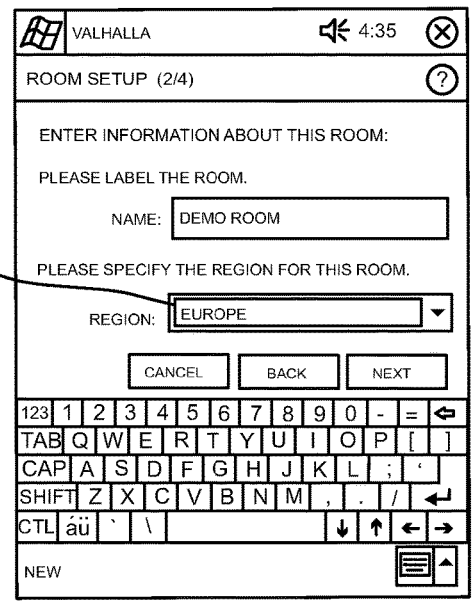
Figure 23C:
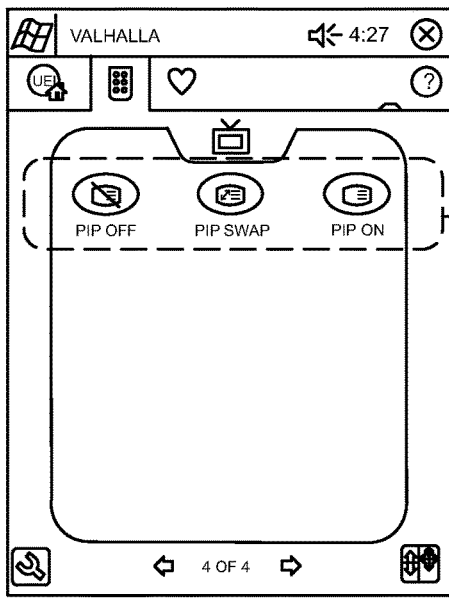
Figure 23D:
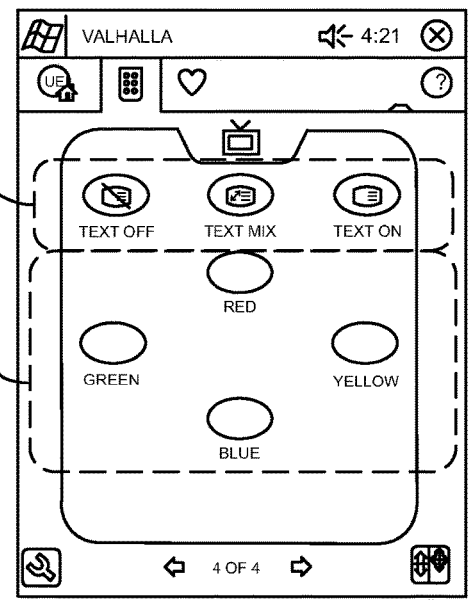

By way of further illustration, control page 4 of the same television brand is shown in FIG. 23*c* as it appears with the region set to "North America," and in FIG. 23*d* as it appears with the region set to "Europe." By way of background explanation, in Europe some television broadcasts include a feature known as "Teletext" in which textual information such as news briefs, weather forecasts, etc. is encoded in the vertical blanking interval of the television signal. Many European market television sets thus may include the capability to decode and display this information under user control. Accordingly, with the region set to "Europe" the remote control application displays soft keys for the functions required to cause control 232 and navigate 234 signals to be transmitted to influence the Teletext data display. Further, as can be seen by comparing keys 232 in FIG. 23*c* versus 23*d*, manufacturers may offer different features in different markets which are invoked by similar control functions—in this instance "Picture in Picture" for the North American market versus Teletext for the European market.

It will also be appreciated that this region selection parameter may also be used internally by the remote control application for other purposes as well, for example it might be used to select one of several possible sets of "Help" data in different languages, either pre-loaded in the PDA 1150 or obtained via download from the desktop PC 1152 or Web hosted services 1106. All string literals may be stored in the Windows brand OS resource file to provide a central location to perform localization work.

While specific embodiments of the present invention have been described in detail, it will be appreciated by those skilled in the art that various modifications and alternatives to those details could be developed in light of the overall teachings of the disclosure. Accordingly, the particular arrangement disclosed is meant to be illustrative only and not limiting as to the scope of the invention which is to be given the full breadth of the appended claims and any equivalents thereof.

What is claimed is:

1. A remote control device for controlling one or more consumer devices of various device types, the remote control comprising:
   a plurality of user input elements;
   an action map having a plurality of action map entries wherein each of the plurality of action map entries is associated with a one of the plurality of user input elements;
   a plurality of device command code sets wherein each of the plurality of device command code sets has a plurality of functions for controlling at least one consumer device;
   a selector configured to allow a user to select individual functions from the plurality of device command code sets appropriate for controlling the one or more consumer devices;
   an activator configured to allow a user to create one or more links between at least one of the selected individual functions of the plurality of device command code sets and action map entries of the action map whereupon an activation of a one of the plurality of user input elements will cause a transmission from the remote control device of the individual functions of the plurality of device command code sets that were selected via use of the selector and linked to the one of the plurality of action map entries assigned to the activated one of the plurality of user input elements via use of the activator; and
   a memory device that is configured to store the plurality of device command code sets and the action map.

2. The remote control device as claimed in claim 1, wherein the remote control device is a multi-mode remote control.

3. The remote control device as claimed in claim 1, comprising a proposer for proposing one of the plurality of device command code sets prior to the selection by the selector.

4. The remote control device as claimed in claim 1, wherein the device command code set corresponds to an operating mode of the remote control device.

5. The remote control device as claimed in claim 1, comprising a touch screen.

6. The remote control device as claimed in claim 1, wherein the remote control device is configured to store functions from outside the remote control device in the memory device of the remote control device.

7. The remote control device as claimed in claim 1, wherein unlinked user input elements are communicated to a user.

8. A method for programming a remote control device having a plurality of user input elements for controlling one or more consumer devices of various device types, the method comprising acts of:
   linking a plurality of device command code sets provided for one or more device types with the plurality of user input elements via use of an action map for one or more consumer devices to be controlled, wherein the action map is stored in a memory of the remote control device, wherein each of the plurality of device command code sets has a plurality of functions for controlling at least one consumer device, wherein the action map has a plurality of action map entries, wherein each of the plurality of action map entries includes at least one function for controlling at least one consumer device, and wherein the plurality of device command code sets are linked with the plurality of user input elements by:
   selecting by a user via one or more interactions with the remote control device an individual function from one of the plurality of device command code sets; and
   creating by the user via one or more interactions with the remote control device links between one of the selected individual functions of any one of the plurality of device command code sets provided for a given device type and action map entries of the action map assigned to a one of the plurality of user input elements, whereupon an activation of a one of the plurality of user input elements will cause a transmission from the remote control device of the individual functions of the plurality of device command code sets that were selected by the user and linked by the user to the one of the plurality of action map entries assigned to the activated one of the plurality of user input elements.

9. The method for programming a remote control device as claimed in claim 8, comprising an act of proposing one of the plurality of device command code sets to the user by the remote control device.

10. The method for programming a remote control device as claimed in claim 9, comprising an act of ordering the plurality of device command code sets proposed to the user based on a predetermined criteria.

11. The method for programming a remote control device as claimed in claim 8, comprising an act of transferring the plurality of device command code sets from a device outside the remote control device for storage in the memory device of the remote control device.

12. The method for programming a remote control device as claimed in claim 8, comprising an act of storing the plurality of device command code sets.

13. The method for programming a remote control device as claimed in claim 8, comprising the act of communicating unlinked user input elements to a user.

14. A programmable remote control device comprising user input elements for controlling one or more consumer devices of various device types and a memory, the memory being configured to store a plurality of device command code sets, and comprising a program of instructions for performing the method comprising acts of:
   linking a plurality of device command code sets provided for one or more device types with the plurality of user input elements via use of an action map for one or more consumer devices to be controlled, wherein the action map is stored in a memory of the remote control device, wherein each of the plurality of device command code sets has a plurality of functions for controlling at least one consumer device, wherein the action map has a plurality of action map entries, wherein each of the plurality of action map entries includes at least one function for controlling at least one consumer device, and wherein the plurality of device command codes sets are linked with the plurality of user input elements by:
   selecting by a user via one or more interactions with the remote control device an individual function from one of the plurality of device command code sets; and
   creating by the user via one or more interactions with the remote control device links between one of the selected individual functions of any one of the plurality of device command code sets provided for a given device type and action map entries of the action map assigned to a one of the plurality of user input elements, whereupon an activation of a one of the plurality of user input elements will cause a transmission from the remote control device of the individual functions of the plurality of device command code sets that were selected by the user and linked by the user to the one of the plurality of action map entries assigned to the activated one of the plurality of user input elements.

15. The programmable remote control device as claimed in claim 14, comprising a program for proposing one of the plurality of device command code sets.

16. The programmable remote control device as claimed in claim 14, comprising a program for ordering the plurality of device command code sets based on a predetermined criteria.

17. The programmable remote control device as claimed in claim 14, wherein unlinked user input elements are communicated to a user.

18. The programmable remote control device as claimed in claim 14, wherein the action map corresponds to an operating mode of the remote control device.

* * * * *